United States Patent
Ueda

(10) Patent No.: US 7,668,005 B2
(45) Date of Patent: Feb. 23, 2010

(54) MAGNETIC MEMORY

(75) Inventor: Yoshihiro Ueda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 75 days.

(21) Appl. No.: 11/743,241

(22) Filed: May 2, 2007

(65) Prior Publication Data

US 2008/0037314 A1 Feb. 14, 2008

(30) Foreign Application Priority Data

Aug. 9, 2006 (JP) ............................. 2006-217331

(51) Int. Cl.
*G11C 11/00* (2006.01)
(52) U.S. Cl. .................. 365/158; 365/148; 365/171; 365/225.5; 365/243.5; 977/935
(58) Field of Classification Search .............. 365/158, 365/48, 66, 80–85, 100, 148, 171, 173, 225.5, 365/243.5; 257/421, E21.665; 438/3; 977/933–935
See application file for complete search history.

(56) References Cited

U.S. PATENT DOCUMENTS 5,640,343 A * 6/1997 Gallagher et al. .......... 365/171
5,695,864 A  12/1997 Slonczewski
6,911,710 B2 * 6/2005 Nickel et al. ............... 257/421
7,190,611 B2 * 3/2007 Nguyen et al. .............. 365/158

FOREIGN PATENT DOCUMENTS

JP 2002-197852 7/2002

* cited by examiner

*Primary Examiner*—Son Dinh
*Assistant Examiner*—Harry W Byrne
(74) *Attorney, Agent, or Firm*—Oblon, Spivak, McClelland, Maier & Neustadt, L.L.P.

(57) ABSTRACT

A magnetic memory includes a plurality of magnetoresistive elements which include a fixed layer in which a magnetization direction is fixed, a free layer in which a magnetization direction changes, and a nonmagnetic layer formed between the fixed layer and the free layer, and a word line electrically connected to the magnetoresistive elements. Data erase is performed by setting the magnetization direction of the free layer in a first direction by a magnetic field induced by a current flowing through the word line, and data of the magnetoresistive elements are erased by one time data erase. Data write is performed by setting the magnetization direction of the free layer in a second direction by spin-transfer magnetization reversal by supplying a current in one direction to the magnetoresistive elements.

15 Claims, 18 Drawing Sheets

| Control signal | Standby | Erase | Write |
|---|---|---|---|
| bPC | H | H | L |
| bEC | H | L | H |
| bRSP1 | H | L | L |
| bRSP2 | H | H | H |
| RSN1 | H | H | L |
| RSN2 | H | H | H |
| CS1 | L | L | H |
| CS2 | L | L | L |
F I G. 1 0
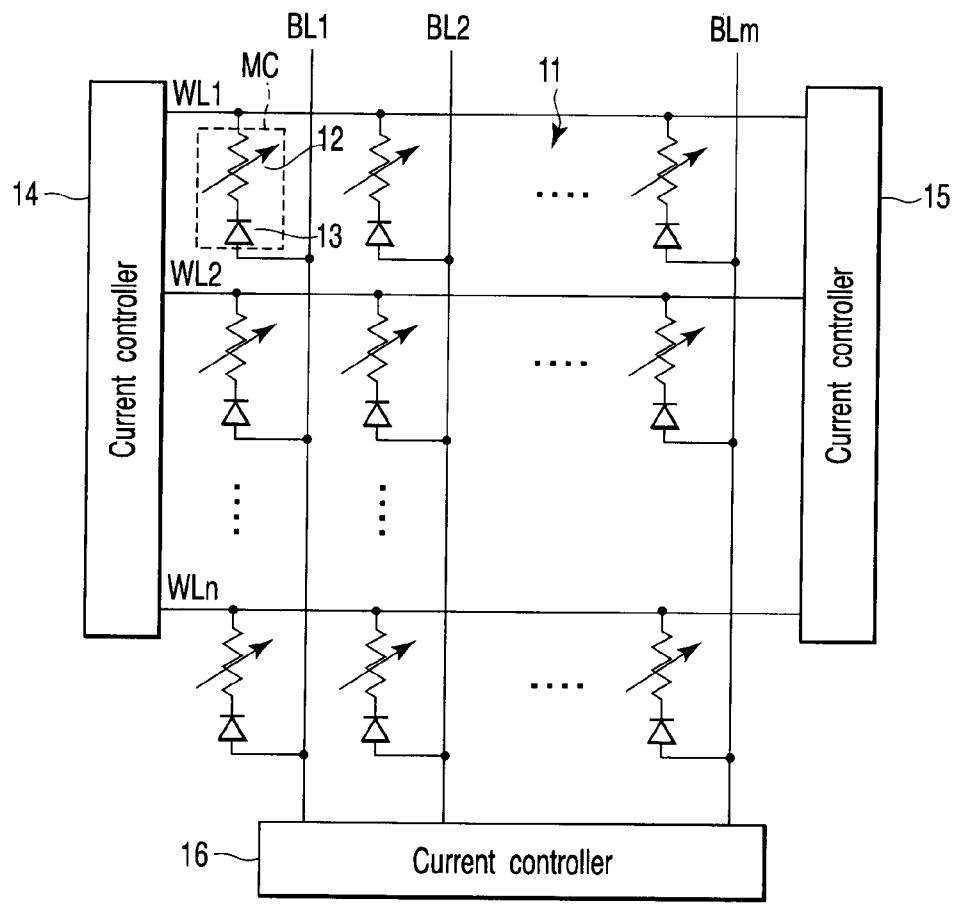
F I G. 1 1

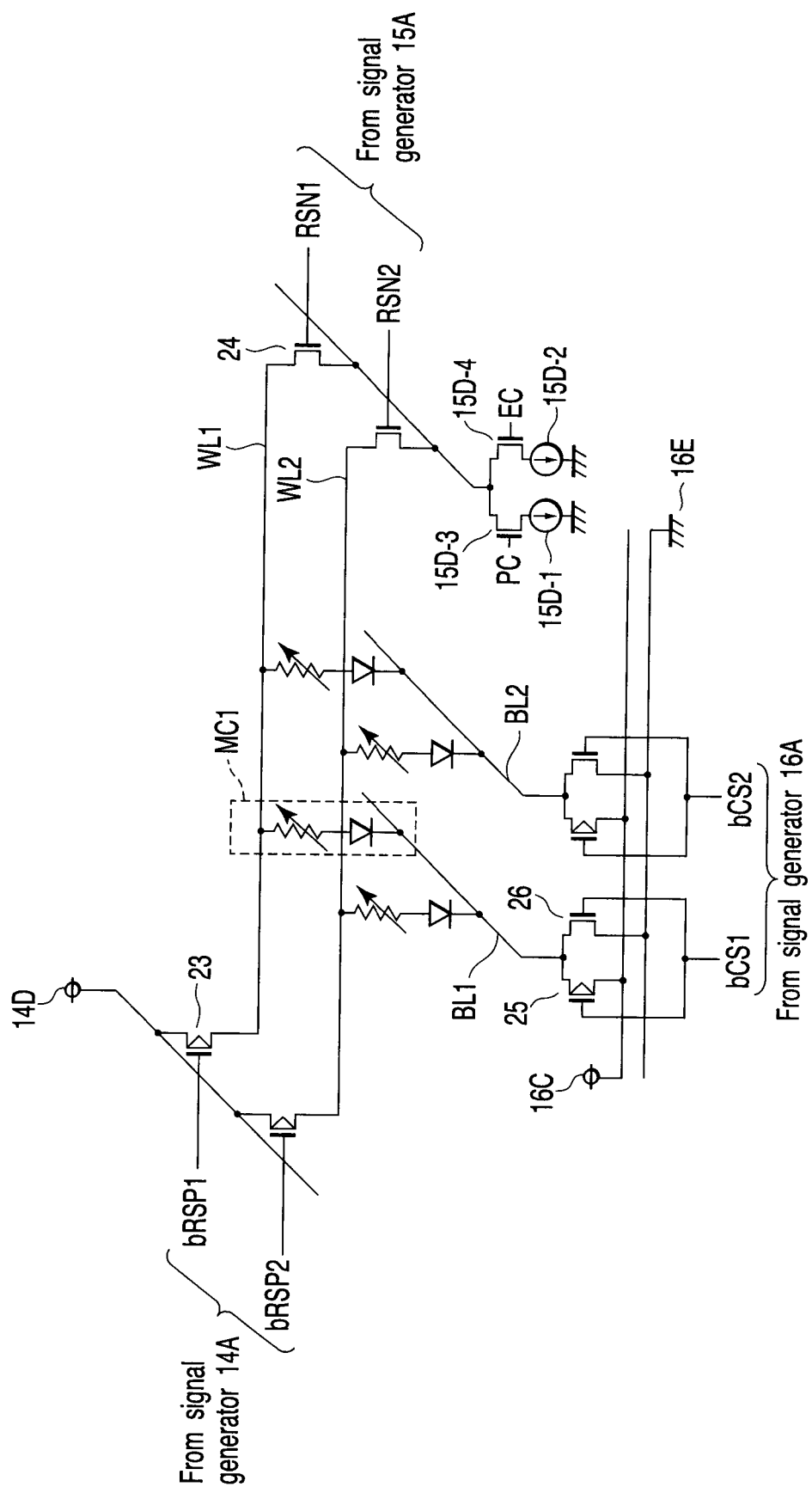
F I G. 14

| Control signal | Standby | Erase | Write |
|---|---|---|---|
| PC | L | L | H |
| EC | L | H | L |
| bRSP1 | L | L | H |
| bRSP2 | L | L | L |
| RSN1 | L | H | H |
| RSN2 | L | L | L |
| bCS1 | H | H | L |
| bCS2 | H | H | H |

FIG. 15

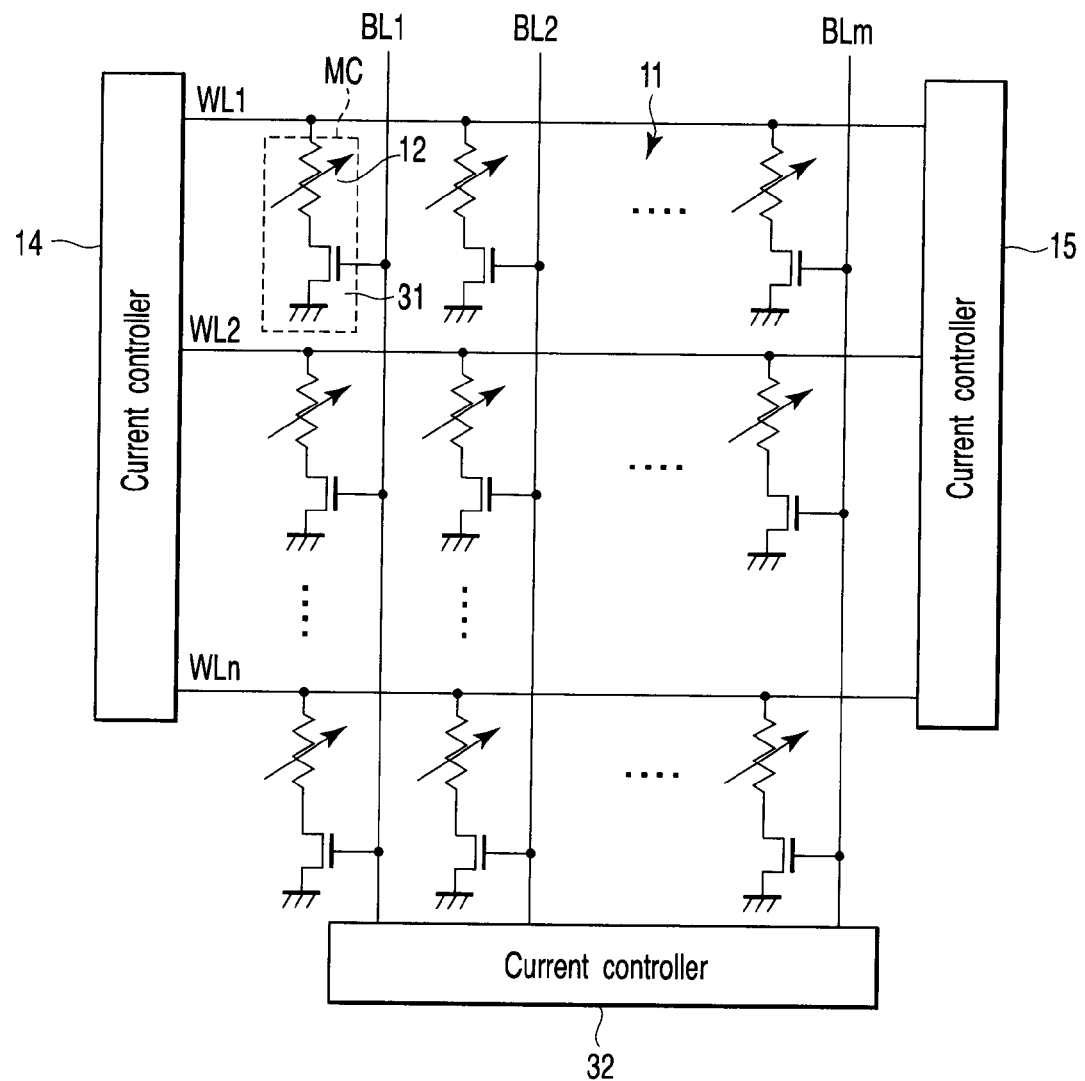
F I G. 20

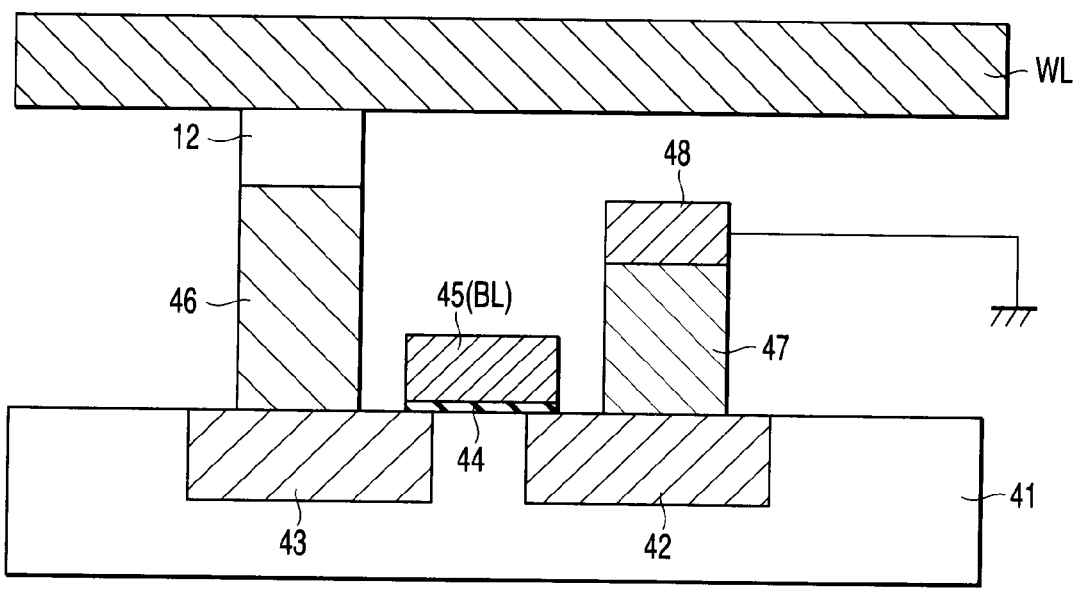
F I G. 21

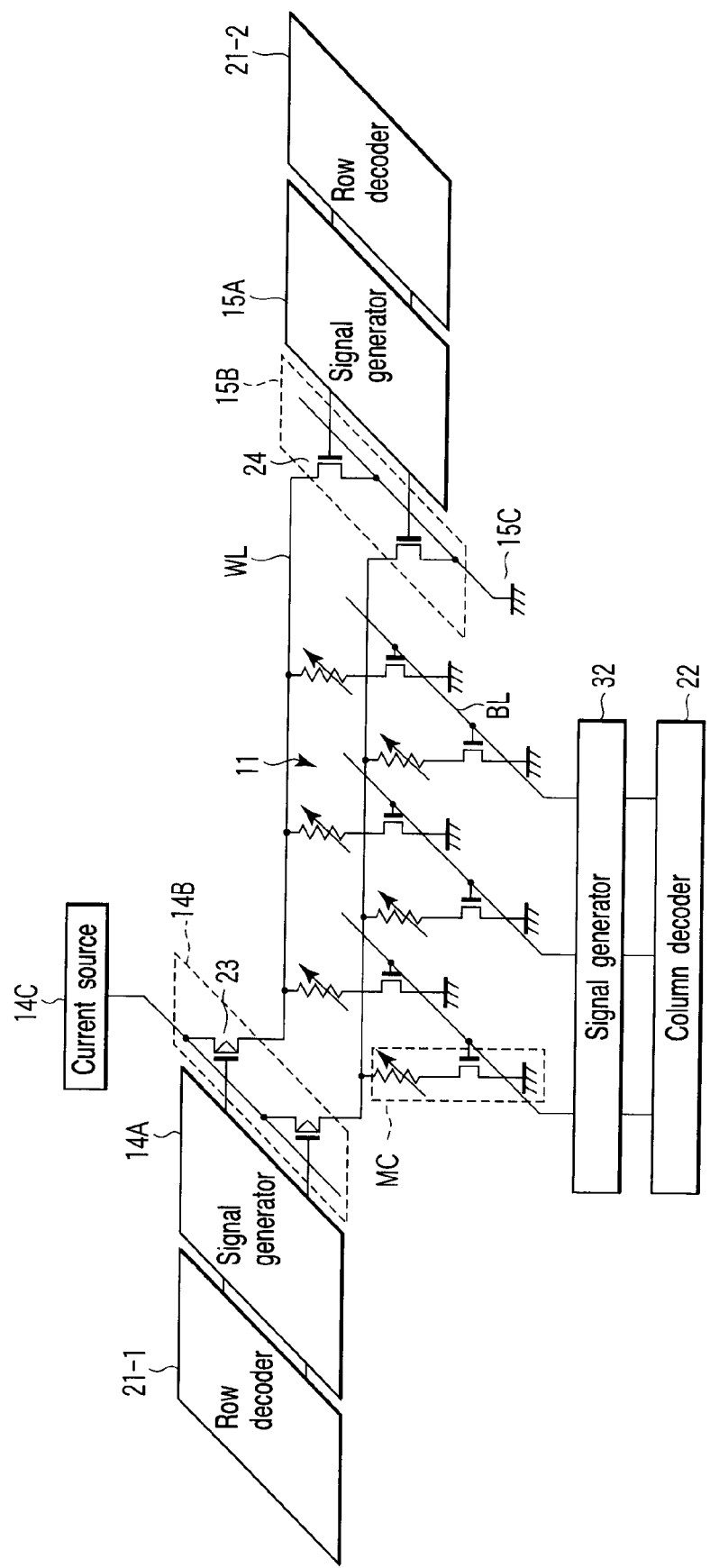
F I G. 22

MAGNETIC MEMORY

CROSS-REFERENCE TO RELATED APPLICATIONS

This application is based upon and claims the benefit of priority from prior Japanese Patent Application No. 2006-217331, filed Aug. 9, 2006, the entire contents of which are incorporated herein by reference.

BACKGROUND OF THE INVENTION

1. Field of the Invention

The present invention relates to a magnetic memory, e.g., a magnetic memory including a magnetoresistive element capable of recording data by supplying a current.

2. Description of the Related Art

Recently, the demands for large-capacity, small-sized information storage devices, represented by a flash memory, are increasing. In the near future, large-volume contents, such as moving images, are likely to be distributed to portable information terminals, so high-speed data transfer is necessary. Accordingly, light-weight, large-capacity information storage devices capable of high-speed transfer are required.

On the other hand, spin-transfer magnetization reversal as a new write principle in a magnetic random access memory (MRAM) as a memory using magnetism is attracting attention as a means for obtaining a capacity at the level of gigabits (see U.S. Pat. No. 5,695,864). The feature of this principle is to supply a current spin-polarized by a fixed layer to a free layer of a magnetoresistive element, and change the direction of magnetization in the free layer in accordance with the direction of the current, thereby writing data. Data is read out by detecting the change in resistance value of the magnetoresistive element by a current, which causes no magnetization reversal. This method is desirable for micropatterning and low power consumption.

As a related technique of this type, a technique which accelerates data read in an MRAM device having an MTJ memory cell is disclosed (see Jpn. Pat. Appln. KOKAI Publication No. 2002-197852).

BRIEF SUMMARY OF THE INVENTION

According to an aspect of the present invention, there is provided a magnetic memory comprising: a plurality of magnetoresistive elements which include a fixed layer in which a magnetization direction is fixed, a free layer in which a magnetization direction changes, and a nonmagnetic layer formed between the fixed layer and the free layer, and records data by a resistance value which changes on the basis of the magnetization direction of the free layer; and a word line electrically connected to one terminal of the magnetoresistive elements. Data erase is performed by setting the magnetization direction of the free layer in a first direction by a magnetic field induced by a current flowing through the word line, and data of the magnetoresistive elements are erased by one time data erase. Data write is performed by setting the magnetization direction of the free layer in a second direction by spin-transfer magnetization reversal by supplying a current in one direction to the magnetoresistive elements.

BRIEF DESCRIPTION OF THE SEVERAL VIEWS OF THE DRAWING

FIG. 10 is a view illustrating the contents of control signals generated by signal generators 14A, 15A, and 16A;

FIG. 11 is a circuit block diagram illustrating an MRAM according to the second embodiment of the present invention;

FIG. 14 is a circuit diagram illustrating the operation of the MRAM according to the second embodiment;

FIG. 15 is a view illustrating the contents of control signals generated by signal generators 14A, 15A, and 16A;

FIG. 20 is a circuit block diagram illustrating an MRAM according to the fifth embodiment of the present invention;

FIG. 21 is a sectional view of a memory cell MC including a magnetoresistive element 12 and selection transistor 31 shown in FIG. 20; and FIG. 22 is a circuit block diagram illustrating current controllers 14 and 15 according to the fifth embodiment.

DETAILED DESCRIPTION OF THE INVENTION

Figure 1:
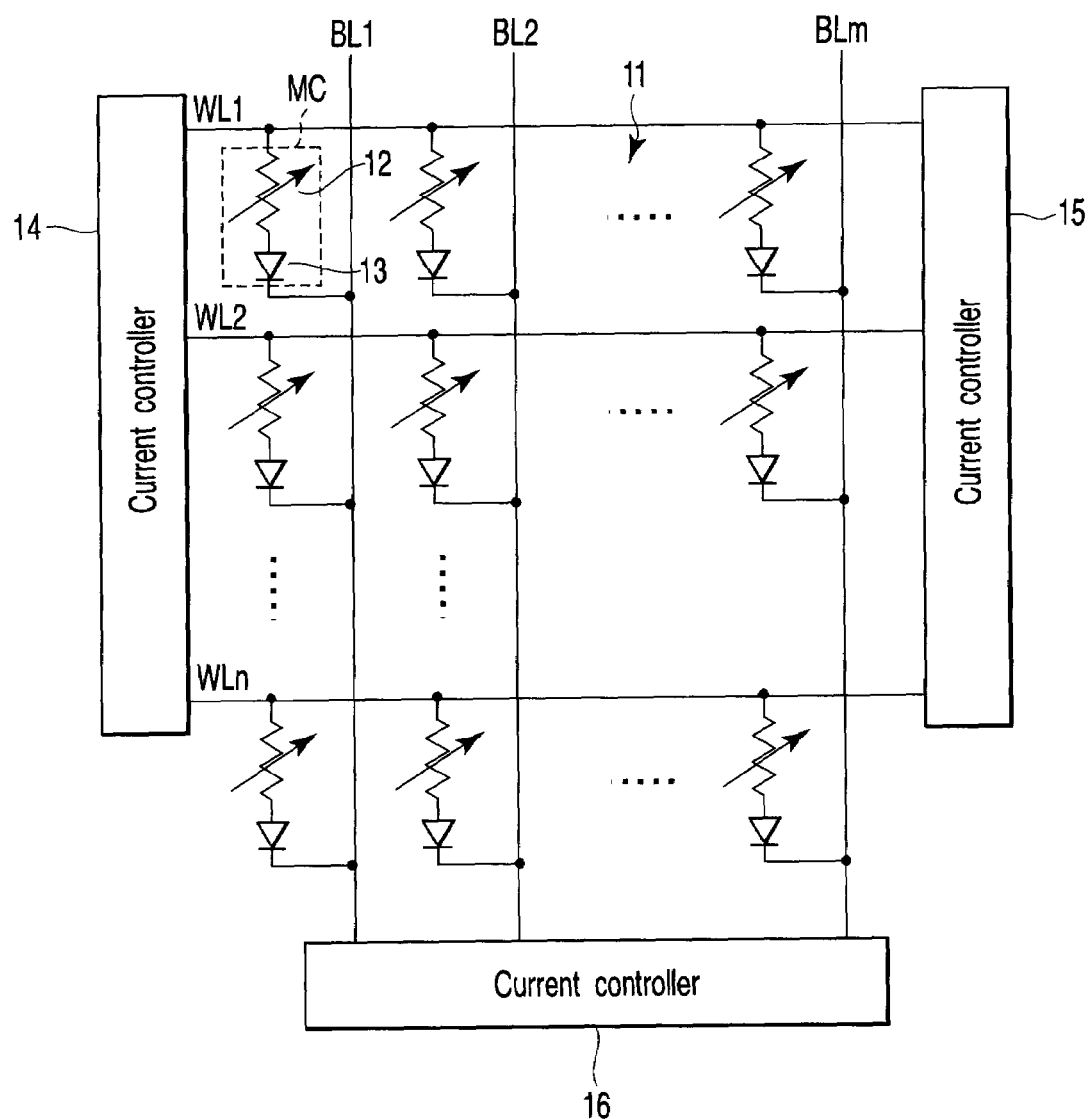
FIG. 1 is a circuit block diagram illustrating an MRAM according to the first embodiment of the present invention.

Embodiments of the present invention will be explained below with reference to the accompanying drawing. Note that in the following explanation, the same reference numerals denote elements having the same functions and arrangements, and a repetitive explanation thereof will be made only when necessary.

First Embodiment

FIG. 1 is a circuit block diagram illustrating an MRAM according to the first embodiment of the present invention. The MRAM includes a memory cell array 11 and current controllers 14 to 16. In the memory cell array 11, a plurality of memory cells MC are arranged in a matrix.

In the memory cell array 11, a plurality of word lines WL1 to WLn are formed to run in the row direction, and a plurality of bit lines BL1 to BLm are formed to run in the column direction. The word line WL selects a row in the memory cell array 11. The bit line BL selects a column in the memory cell array 11. The memory cells MC are arranged at the intersections of the word lines WL and bit lines BL.

The current controller 14 is connected to one end of each of the word lines WL1 to WLn. The current controller 15 is connected to the other end of each of the word lines WL1 to WLn. To supply a current (e.g., an erase current or write current) to the word lines WL1 to WLn, the current controller 14 applies a positive voltage to one end of each of the word lines WL1 to WLn. To supply a current to the word lines WL1 to WLn, the current controller 15 applies, e.g., the ground voltage to the other end of each of the word lines WL1 to WLn.

The current controller 16 is connected to the bit lines BL1 to BLm. To supply the write current or the like to selected memory cells MC, the current controller 16 applies the ground voltage to the bit lines BL1 to BLm. Also, to supply no current to nonselected memory cells, the current controller 16 applies a positive voltage to the bit lines BL1 to BLm. Practical arrangements of the current controllers 14 to 16 will be described later.

The memory cell MC comprises a magnetoresistive element 12 and diode 13. One terminal of the magnetoresistive element 12 is electrically connected to the word line WL. The other terminal of the magnetoresistive element 12 is electrically connected to the anode of the diode 13. The cathode of the diode 13 is electrically connected to the bit line BL. The diode 13 functions to supply only a current that flows from the word line WL to the bit line BL via the magnetoresistive element 12.

Figure 2:
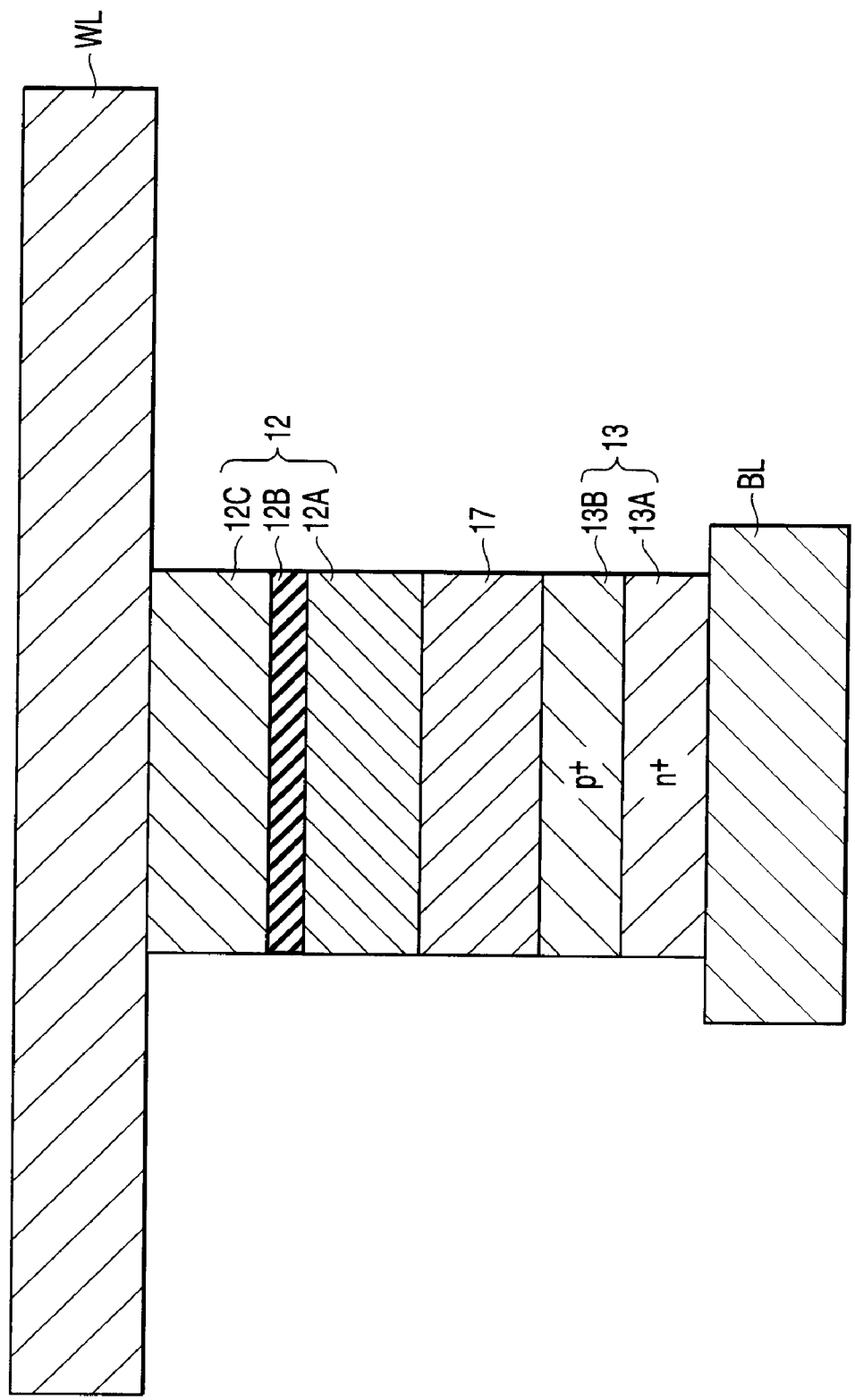
FIG. 2 is a sectional view of a memory cell MC including a magnetoresistive element 12 and diode 13 shown in FIG. 1.

FIG. 2 is a sectional view of the memory cell MC including the magnetoresistive element 12 and diode 13 shown in FIG. 1. Note that FIG. 2 shows the section of the memory cell MC cut in the direction in which the word line WL runs.

The diode 13 is formed on the bit line BL. The diode 13 comprises an $n^+$-type semiconductor layer 13A, and a $p^+$-type semiconductor layer 13B formed on the $n^+$-type semiconductor layer 13A. The $n^+$-type semiconductor layer 13A is formed by heavily doping an $n^+$-type impurity (e.g., P (phosphorus) or As (arsenic)) into polysilicon. The $p^+$-type semiconductor layer 13B is formed by heavily doping a $p^+$-type impurity (e.g., B (boron)) into polysilicon.

An electrode 17 is formed on the diode 13. The magnetoresistive element 12 is formed on the electrode 17.

The magnetoresistive element 12 has a stacked structure in which a fixed layer (pinned layer) 12A, tunnel barrier layer 12B, and free layer 12C are sequentially stacked. In the pinned layer 12A, the direction of magnetization (or spin) is fixed. In the free layer 12C, the direction of magnetization changes (reverses). The easy magnetization directions in the pinned layer 12A and free layer 12C are set, e.g., parallel to the film surface (or the stacked layer surface).

The pinned layer 12A and free layer 12C are made of a ferromagnetic material. The tunnel barrier layer 12B is made of a nonmagnetic material, e.g., an insulator. Examples of the insulator are MgO (magnesium oxide) or $AlO_x$ (aluminum oxide).

The magnetoresistive element 12 has the magnetoresistive effect by which the resistance value changes in accordance with the magnetization directions in the pinned layer 12A and free layer 12C. That is, when the magnetization directions in the pinned layer 12A and free layer 12C are antiparallel (opposite), the resistance value of the magnetoresistive element 12 is a maximum. This state is defined as, e.g., data "0". On the other hand, when the magnetization directions in the pinned layer 12A and free layer 12C are parallel (the same), the resistance value of the magnetoresistive element 12 is a minimum. This state is defined as, e.g., data "1".

The magnetoresistive element 12 is a spin injection type magnetoresistive element. That is, to record data "1" (write data) in the magnetoresistive element 12, a current is directly supplied to the magnetoresistive element 12. The magnetoresistive element 12 can also record data by a magnetic field generated by a current flowing through a line. That is, to record data "0" in (erase data from) the magnetoresistive element 12, a magnetic field is applied to the free layer 12C.

The word line WL is formed on the magnetoresistive element 12. Note that the free layer 12C is formed close to the word line WL. With this arrangement, a magnetic field generated from the word line WL can be efficiently applied to the free layer 12C. The word line WL, bit line BL, and electrode 17 are made of a metal such as Cu (copper).

Figure 3:
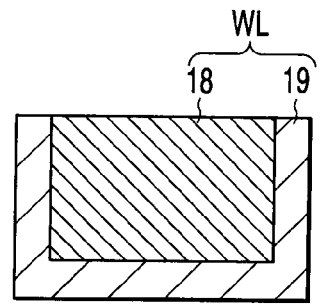
FIG. 3 is a sectional view of a word line WL shown in FIG. 2.

To increase the efficiency of conversion from a current into a magnetic field, it is also possible to use a yoke line formed by covering portions of the line with a magnetic material. FIG. 3 is a sectional view of the word line WL shown in FIG. 2. Note that FIG. 3 shows the section of the word line WL cut perpendicularly to the direction in which the word line WL runs.

The word line WL comprises a wiring layer 18 and a yoke layer 19 covering portions of the interconnection line 18. More specifically, the yoke layer 19 covers the bottom surface and two side surfaces of the wiring layer 18. The wiring layer 18 mainly has a function of generating a magnetic field, and is made of a metal such as Cu (copper). The yoke layer 19 has a function of efficiently concentrating the magnetic field generated from the wiring layer 18 to the magnetoresistive element 12. The yoke layer 19 is desirably made of a high-k material, and a magnetic material such as an Ni—Fe alloy is used.

Figure 4:
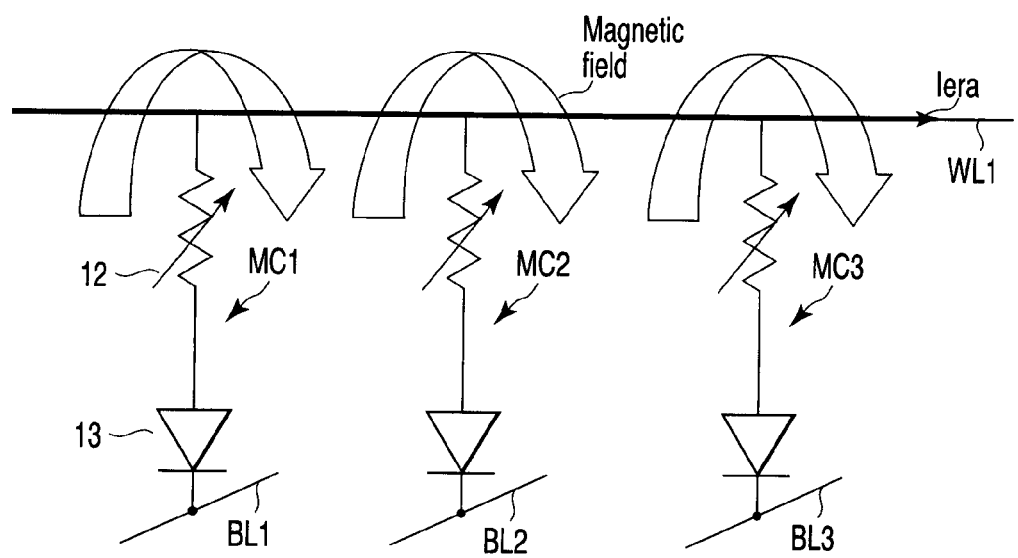
FIG. 4 is a schematic view illustrating data erase from the memory cell MC.

The operation of the MRAM having the above arrangement will be explained below. First, data erase from the memory cell MC will be explained. FIG. 4 is a schematic view illustrating the operation of erasing data from the memory cell MC. In this embodiment, data is erased from the memory cell MC by using a current-induced magnetic field. Also, data is simultaneously erased from a plurality of memory cells MC connected to one word line WL.

The current controller 14 applies a positive erase voltage to one end of the word line WL1. The current controller 15 applies the ground voltage to the other end of the word line WL1. Consequently, an erase current Iera flows through the word line WL1 from the current controller 14 to the current controller 15. This generates, around the word line WL1, a magnetic field in a direction resulting from the flowing direction of the erase current Iera. The magnetic field changes the magnetization direction in the free layer 12C to a direction indicating the erase state. Note that the magnetoresistive element 12 is formed along the direction in which the word line WL runs, so that the current-induced magnetic field reverses the magnetization direction in the free layer 12C to the direction opposite to the magnetization direction in the pinned layer 12A.

Also, during data erase, it is necessary to prevent the erase current Iera flowing through the word line WL1 from flowing to the memory cells MC. Therefore, the voltage controller 16 applies a voltage (e.g., the power supply voltage) equal to or higher than the erase voltage to all the bit lines BL connected to the word line WL1 via the memory cells MC. This reversely biases the diodes 13 of the memory cells MC connected to the word line WL1.

Figure 5:
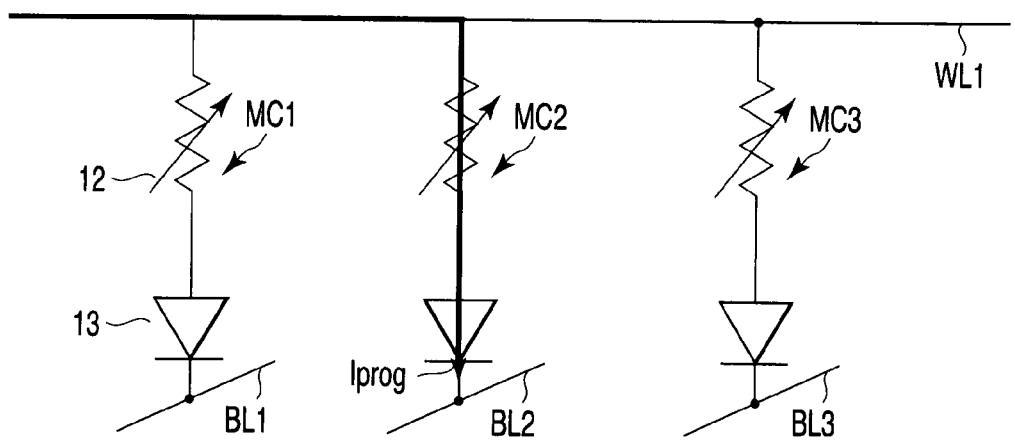
FIG. 5 is a schematic view illustrating data write to the memory cell MC.

Next, data write to the memory cell MC will be explained. FIG. 5 is a schematic view illustrating the operation of writing data in the memory cell MC. In this embodiment, data write (data program) to the memory cell MC is individually performed by selecting one memory cell MC.

Data write is performed by changing the magnetization direction in the free layer 12C to a direction indicating the write state (a direction opposite to the direction indicating the erase state) by spin-transfer magnetization reversal. More specifically, data write is performed by supplying a write current Iprog flowing from the word line WL to the bit line BL directly to the magnetoresistive element 12. In this case, electrons flow from the bit line BL to the word line WL.

These electrons are spin-polarized in the same direction as the magnetization direction in the pinned layer 12A when passing through it, and injected into the free layer 12C. This makes the magnetization direction in the free layer 12C equal to the magnetization direction in the pinned layer 12A.

The word line WL and bit line BL select the memory cell MC as an object of data write. During data write, to prevent write errors in nonselected memory cells MC, the voltage of nonselected bit lines BL is set higher than that of the word lines WL, thereby reversely biasing the diodes 13 of the nonselected memory cells MC.

The case that data is written in a memory cell MC2 of memory cells MC1 to MC3 connected to the word line WL1 will be explained below as an example. First, the current controller 14 applies a positive write voltage to one end of the word line WL1. The current controller 16 applies the ground voltage to the bit line BL2. Consequently, the write current Iprog flows through the memory cell MC2 from the word line WL1 to the bit line BL2.

On the other hand, the current controller 16 applies a voltage (e.g., the power supply voltage) equal to or higher than the write voltage to the bit lines BL1 and BL3. This reversely biases the diodes 13 of the nonselected memory cells MC1 and MC3.

Figure 6:
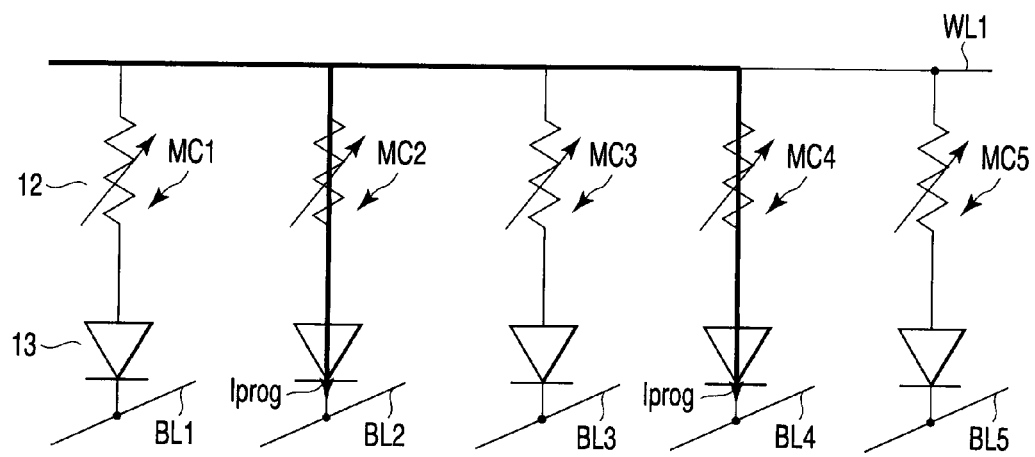
FIG. 6 is a schematic view illustrating simultaneous data write to a plurality of magnetoresistive elements 12.

It is also possible to simultaneously write data in a plurality of memory cells MC connected to the same word line WL. FIG. 6 is a schematic view illustrating the operation of simultaneously writing data in a plurality of magnetoresistive elements 12.

The case that data is simultaneously written in two memory cells MC2 and MC4 of memory cells MC1 to MC5 connected to the word line WL1 will be explained below as an example. First, the current controller 14 applies a positive write voltage to one end of the word line WL. The current controller 16 applies the ground voltage to the bit lines BL2 and BL4. As a result, the write current Iprog flows through the memory cells MC2 and MC4.

On the other hand, the current controller 16 applies a voltage equal to or higher than the write voltage to the bit lines BL1, BL3, and BL5. This reversely biases the diodes 13 of the nonselected memory cells MC1, MC3, and MC5.

Figure 7:
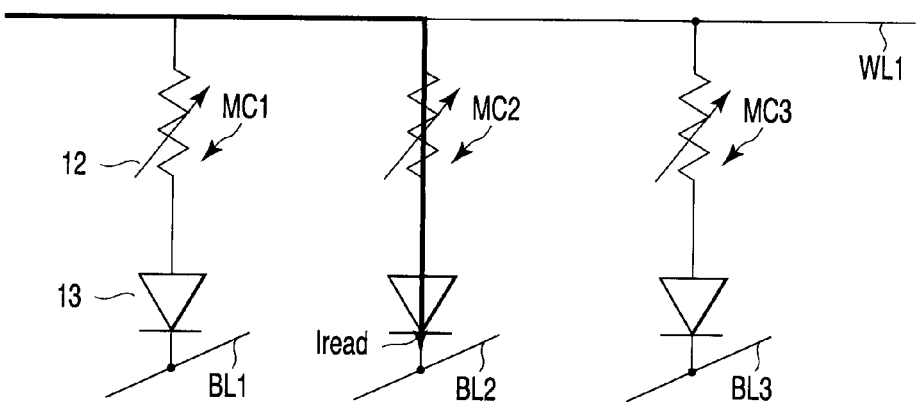
FIG. 7 is a schematic view illustrating data read from the memory cell MC.

Next, data read from the memory cell MC will be explained. FIG. 7 is a schematic view illustrating the operation of reading out data from the memory cell MC.

Data read is performed by detecting the resistance value of the magnetoresistive element 12 by supplying a read current Iread to it. The read current Iread is set so as not to cause any magnetization reversal in the free layer 12C.

The word line WL and bit line BL select the memory cell MC as an object of data read. A selected word line WL is electrically connected to a read circuit (not shown), and a selected bit line BL is electrically connected to the ground terminal. The read circuit applies a predetermined bias voltage to the magnetoresistive element 12, and determines the resistance value of the magnetoresistive element 12 by comparing the current value with a reference current value.

The case that data is read out from a memory cell MC2 of memory cells MC1 to MC3 connected to the word line WL1 will be explained as an example. First, one end of the word line WL1 is electrically connected to the read circuit. The current controller 16 applies the ground voltage to the bit line BL2. Consequently, the read current Iread flows through the memory cell MC2 from the word line WL1 to the bit line BL2. On the other hand, the current controller 16 applies a predetermined voltage to the bit lines BL1 and BL2 to reversely bias the diodes 13 of the nonselected memory cells MC1 and MC3.

Figure 8:
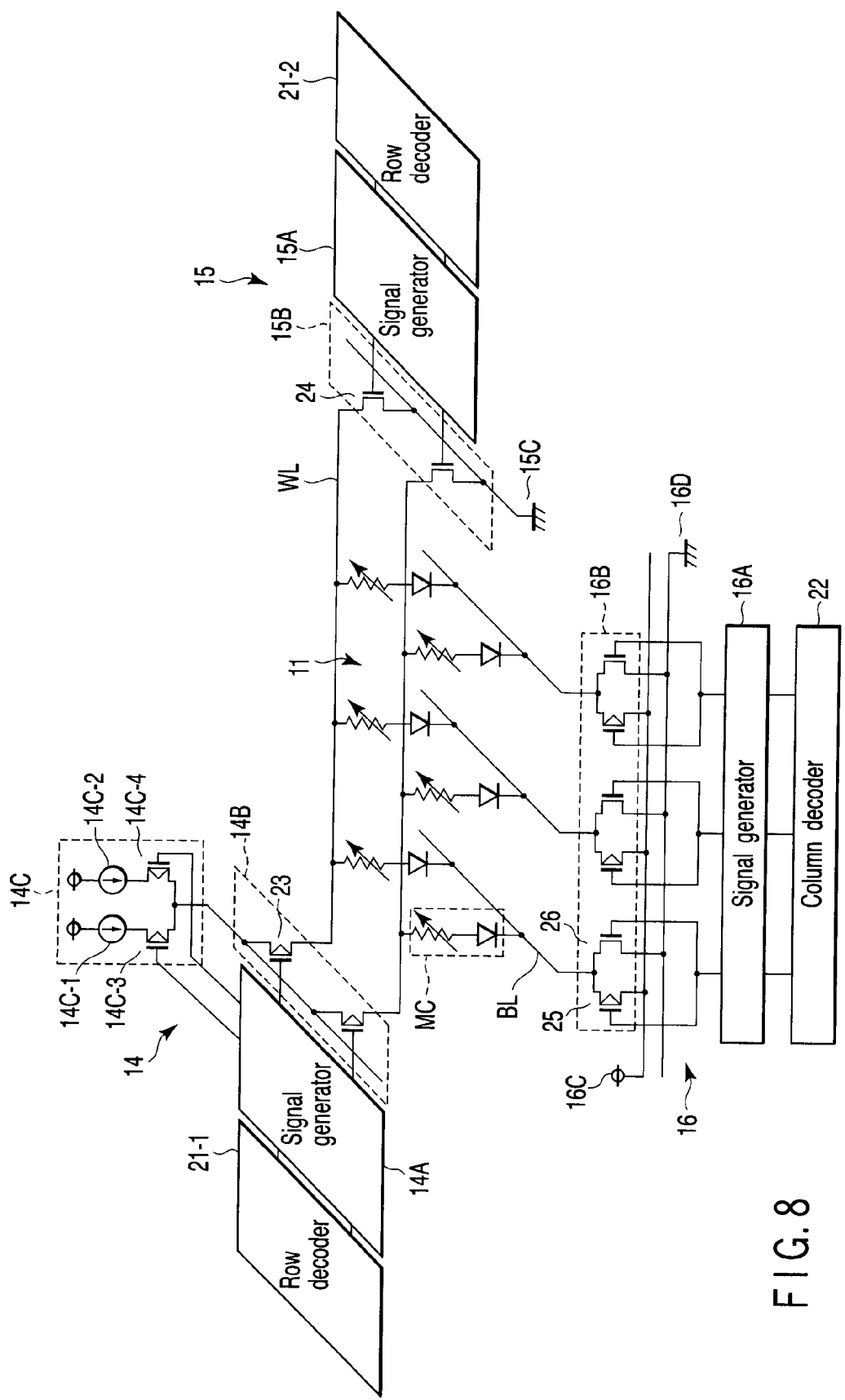
FIG. 8 is a circuit block diagram illustrating current controllers 14 to 16 according to the first embodiment.

Examples of practical circuit configurations of the current controllers 14 to 16 shown in FIG. 1 will be explained below. FIG. 8 is a circuit block diagram illustrating the current controllers 14 to 16.

The current controller 14 comprises a signal generator 14A, switching circuit 14B, and current source 14C. The current source 14C supplies currents corresponding to the erase and write operations to the switching circuit 14B. The current source 14C comprises a write current source 14C-1, an erase current source 14C-2, and switching elements 14C-3 and 14C-4. The write current source 14C-1 generates the write current. The erase current source 14C-2 generates the erase current. Each of the switching elements 14C-3 and 14C-4 is, e.g., a p-channel MOS (Metal Oxide Semiconductor) transistor.

The source terminal of the p-channel MOS transistor (PMOS transistor) 14C-3 is connected to the write current source 14C-1. The drain terminal of the PMOS transistor 14C-3 is connected to the switching circuit 14B. The signal generator 14A supplies a control signal to the gate terminal of the pMOS transistor 14C-3. The source terminal of the pMOS transistor 14C-4 is connected to the erase current source 14C-2. The drain terminal of the pMOS transistor 14C-4 is connected to the switching circuit 14B. The signal generator 14A supplies a control signal to the gate terminal of the pMOS transistor 14C-4.

The switching circuit 14B connects/disconnects the current source 14C and word lines WL1 to WLn. The switching circuit 14B comprises a plurality of switching elements 23 corresponding to the word lines WL1 to WLn. The switching element 23 is, e.g., a pMOS transistor 23. The source terminal of the pMOS transistor 23 is connected to the current source 14C. The drain terminal of the PMOS transistor 23 is connected to the word line WL. The signal generator 14A supplies a control signal to the gate terminal of the pMOS transistor 23.

A row decoder 21-1 is connected to the signal generator 14A. The row decoder 21-1 decodes an externally supplied row address signal, and selects a corresponding one of the word lines WL. The row decoder 21-1 then supplies the decoded signal to the signal generator 14A.

On the basis of the decoded signal supplied from the row decoder 21-1, the signal generator 14A generates a control signal for electrically connecting the current source 14C to the selected word line WL. The switching circuit 14B receives this control signal. The signal generator 14A also generates a control signal for selecting the write current or erase current. The current source 14C receives this control signal.

The current controller 15 comprises a signal generator 15A, switching circuit 15B, and current sink (current drain) 15C. A row decoder 21-2 is connected to the signal generator 15A. The row decoder 21-2 decodes an externally supplied row address signal to select a corresponding one of the word lines WL. The row decoder 21-2 then supplies the decoded signal to the signal generator 15A.

On the basis of the decoded signal supplied from the row decoder 21-2, the signal generator 15A generates a control signal for electrically connecting the current sink 15C to the selected word line WL. The switching circuit 15B receives this control signal.

The current sink 15C sinks a current flowing through the word line WL to the ground terminal. The switching circuit 15B connects/disconnects the current sink 15C and word lines WL1 to WLn.

The switching circuit 15B comprises a plurality of switching elements 24 corresponding to the word lines WL1 to WLn. The switching element 24 is, e.g., an n-channel MOS transistor (nMOS transistor) 24. The source terminal of the nMOS transistor 24 is connected to the current sink 15C. The drain terminal of the nMOS transistor 24 is connected to the word line WL. The signal generator 15A supplies a control signal to the gate terminal of the nMOS transistor 24.

The current controller 16 comprises a signal generator 16A, switching circuit 16B, power supply 16C, and current sink 16D. A column decoder 22 is connected to the signal generator 16A. The column decoder 22 decodes an externally supplied column address signal to select a corresponding one of the bit lines BL. The column decoder 22 supplies the decoded signal to the signal generator 16A.

On the basis of the decoded signal supplied from the column decoder 22, the signal generator 16A generates a first control signal for electrically connecting the current sink 16D to the selected bit line BL. The signal generator 16A also generates a second control signal for electrically connecting the power supply 16C to nonselected bit lines BL, on the basis of the decoded signal supplied from the column decoder 22. In addition, during an erase operation, the signal generator 16A generates a third control signal for electrically connecting the power supply 16C to all the bit lines BL. The switching circuit 16B receives the first to third control signals.

The power supply 16C generates a predetermined voltage (e.g., the power supply voltage) for reversely biasing the diode 13 of the memory cell MC. The switching circuit 16B receives this predetermined voltage. The current sink 16D sinks a current flowing through the bit line BL to the ground terminal.

The switching circuit 16B connects/disconnects the power supply 16C and bit lines BL1 to BLm, and connects/disconnects the current sink 16D and bit lines BL1 to BLm. The switching circuit 16B comprises a plurality of switching elements 25 corresponding to the bit lines BL1 to BLm, and a plurality of switching elements 26 corresponding to the bit lines BL1 to BLm.

The switching element 25 is, e.g., a PMOS transistor 25. The source terminal of the pMOS transistor 25 is connected to the power supply 16C. The drain terminal of the pMOS transistor 25 is connected to the bit line BL. The signal generator 16A supplies the second and third control signals to the gate terminal of the PMOS transistor 25.

The switching element 26 is, e.g., an nMOS transistor 26. The source terminal of the nMOS transistor 26 is connected to the current sink 16D. The drain terminal of the nMOS transistor 26 is connected to the bit line BL. The signal generator 16A supplies the first control signal to the gate terminal of the nMOS transistor 26.

Figure 9:
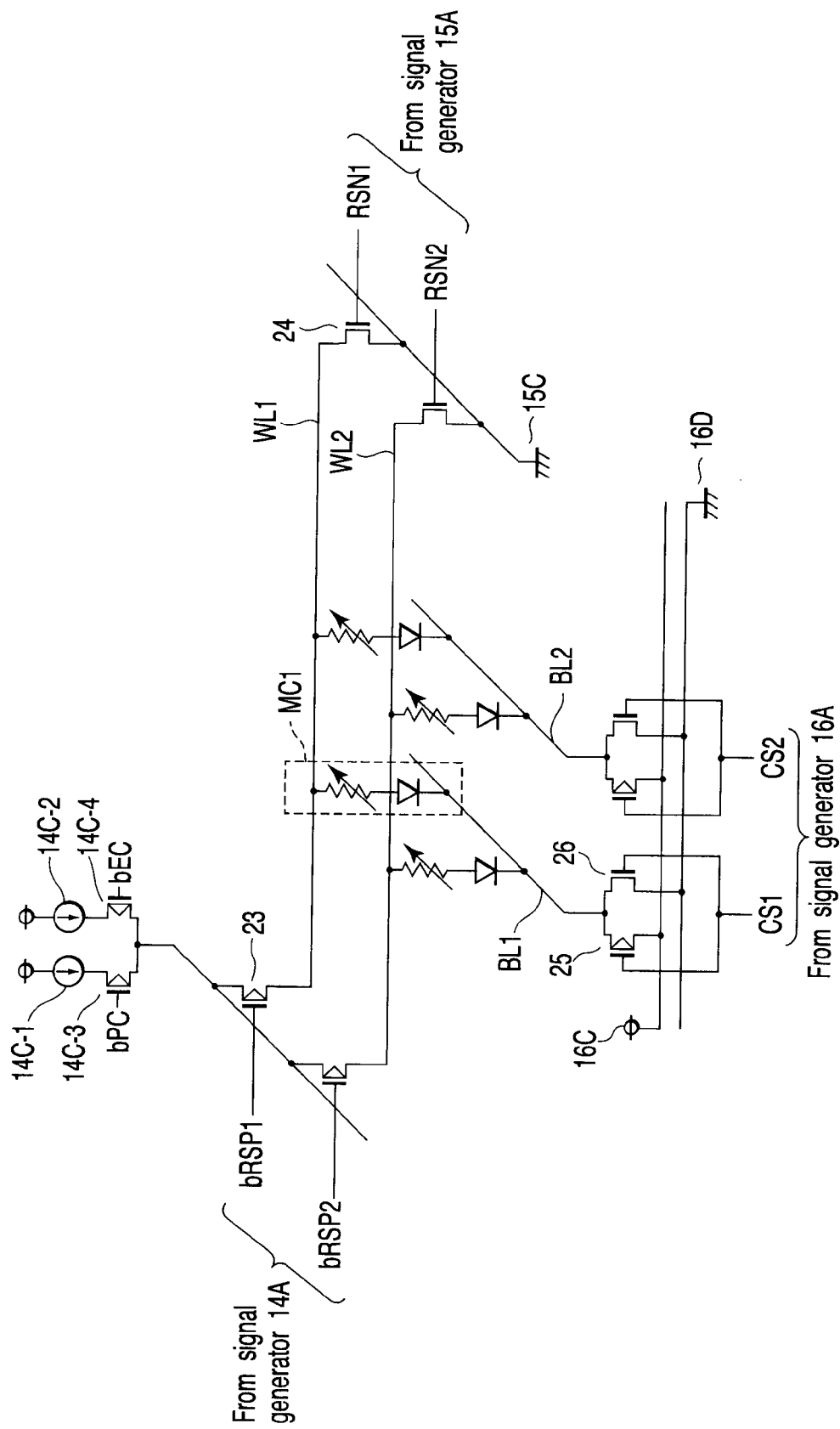
FIG. 9 is a circuit diagram illustrating the operation of the MRAM according to the firs embodiment.

The operation of the MRAM having the arrangement as shown in FIG. 8 will be explained below. FIG. 9 is a circuit diagram illustrating the operation of the MRAM. FIG. 10 is a view illustrating the contents of control signals generated by the signal generators 14A, 15A, and 16A. Note that for easy understanding of the operation, FIG. 9 shows two word lines WL (the word lines WL1 and WL2) and two bit lines BL (the bit lines BL1 and BL2) as examples.

First, the operation of the MRAM in a standby state will be explained. In the standby state, the signal generator 14A generates High-level control signals bPC and bEC. The pMOS transistors 14C-3 and 14C-4 respectively receive the control signals bPC and bEC at their gate terminals. This turns off the pMOS transistors 14C-3 and 14C-4.

The signal generator 14A also generates High-level control signals bRSP1 and bRSP2. The PMOS transistors 23 corresponding to the control signals bRSP1 and bRSP2 receive them at their gate terminals. This turns off all the pMOS transistors 23.

The signal generator 15A generates High-level control signals RSN1 and RSN2. The nMOS transistors 24 corresponding to the control signals RSN1 and RSN2 receive them at their gate terminals. This electrically connects the word lines WL1 and WL2 to the current sink 15C.

The signal generator 16A generates Low-level control signals CS1 and CS2. The pMOS transistor 25 and nMOS transistor 26 corresponding to the control signal CS1 receive it at their gate terminals. The pMOS transistor 25 and nMOS transistor 26 corresponding to the control signal CS2 receive it at their gate terminals. This electrically connects the bit lines BL1 and BL2 to the power supply 16C.

The above control in the standby state reversely biases the diode 13 of each memory cell MC. That is, no current flows to any memory cell MC.

Next, data erase from the memory cell MC will be explained below. Note that data erase from two memory cells connected to the word line WL1 will be explained as an example.

The signal generator 14A generates a High-level signal bPC and Low-level signal bEC. This turns off the pMOS transistor 14C-3, and turns on the pMOS transistor 14C-4.

Also, on the basis of the decoded signal from the row decoder 21-1, the signal generator 14A generates a Low-level control signal bRSP1 in order to turn on the pMOS transistor 23 connected to the selected word line WL1. Furthermore, on the basis of the decoded signal from the row decoder 21-1, the signal generator 14A generates a High-level control signal bRSP2 in order to turn off the pMOS transistor 23 connected to the nonselected word line WL2. This electrically connects the erase current source 14C-2 and word line WL1.

On the basis of the decoded signal from the row decoder 21-2, the signal generator 15A generates a High-level control signal RSN1 in order to turn on the nMOS transistor 24 connected to the selected word line WL1. The signal generator 15A also generates a High-level control signal RSN2. This electrically connects the word line WL2 and current sink 15C. This turns on all the nMOS transistors 24, and electrically connects the word lines WL1 and WL2 to the current sink 15C.

The above control in the erase operation supplies the erase current Iera to only the word line WL1. In this manner, data in a plurality of memory cells MC connected to the selected word line WL is simultaneously erased.

During data erase, it is necessary to prevent the erase current Iera flowing through the word line WL1 from flowing to the memory cell MC. Therefore, the signal generator 16A generates Low-level control signals CS1 and CS2. This electrically connects the bit lines BL1 and BL2 to the power supply 16C, and reversely biases the diodes 13 of the memory cells MC connected to the word line WL1.

Data write to the memory cell MC will be explained below. Note that data write to a memory cell MC1 connected to the word line WL1 and bit line BL1 will be explained as an example.

The signal generator 14A generates a Low-level control signal bPC and High-level control signal bEC. This turns on the pMOS transistor 14C-3, and turns off the pMOS transistor 14C-4.

Also, on the basis of the decoded signal from the row decoder 21-1, the signal generator 14A generates a Low-level control signal bRSP1 in order to turn on the pMOS transistor 23 connected to the selected word line WL1. Furthermore, on the basis of the decoded signal from the row decoder 21-1, the signal generator 14A generates a High-level control signal bRSP2 in order to turn off the pMOS transistor 23 connected to the nonselected word line WL2. This electrically connects the write current source 14C-1 and word line WL1.

On the basis of the decoded signal from the row decoder 21-2, the signal generator 15A generates a Low-level control signal RSN1 and High-level control signal RSN2. This electrically connects the word line WL2 and current sink 15C.

On the basis of the decoded signal from the column decoder 22, the signal generator 16A generates a High-level control signal CS1. This electrically connects the bit line BL1 and current sink 16D.

The above control in the write operation supplies the write current Iprog to only the selected memory cell MC1. In this manner, data is written in the selected memory cell MC1.

In this case, it is necessary to prevent the write current Iprog from flowing to nonselected memory cells MC. Therefore, the signal generator 16A generates a Low-level control signal CS2 in order to turn on the pMOS transistor 25 connected to the nonselected bit line BL2. This electrically connects the bit line BL2 and power supply 16C, and reversely biases the diodes 13 of the memory cells MC connected to the nonselected bit line BL2.

Data read from the memory cell MC will be explained below. Note that data read from the memory cell MC1 connected to the word line WL1 and bit line BL1 will be explained as an example.

Each word line WL is also connected to the read circuit (not shown). On the basis of the decoded signal from the row decoder 21-1, the signal generator 14A electrically connects the selected word line WL1 and read circuit.

On the basis of the decoded signal from the column decoder 22, the signal generator 16A generates a High-level control signal CS1 in order to turn on the nMOS transistor 26 connected to the selected bit line BL1. This turns on the nMOS transistor 26 corresponding to the bit line BL1, and electrically connects the bit line BL1 to the current sink 16D.

The signal generator 16A also generates a Low-level control signal CS2 in order to turn on the pMOS transistor 25 connected to the nonselected bit line BL2. This electrically connects the bit line BL2 and power supply 16C, and reversely biases the diodes 13 of the memory cells MC connected to the nonselected bit line BL2.

The above control in the read operation supplies the read current Iread to only the selected memory cell MC1. In this way, data is read out from the selected memory cell MC1.

As has been described in detail above, this embodiment can form the memory cell MC by using the magnetoresistive element 12 and diode 13.

It is also possible to simultaneously erase data from a plurality of memory cells. In addition, data can be simultaneously written in a plurality of memory cells. This enables high-speed erase and write operations.

Furthermore, since the memory cell MC uses no transistor, no magnetoresistive element 12 need be formed on a semiconductor substrate on which transistors are formed. This makes micropatterning of the MRAM in the horizontal direction feasible. Consequently, it is possible to increase the capacity of the MRAM while suppressing the increase in chip area.

It is also possible to give the memory cell MC a stacked structure because the diode 13 is used in the memory cell MC. This makes micropatterning of the MRAM in the vertical direction possible. As a result, the capacity of the MRAM increases.

Second Embodiment

The second embodiment forms a memory cell MC by connecting a diode 13 explained in the first embodiment in the opposite direction.

FIG. 11 is a circuit block diagram illustrating an MRAM according to the second embodiment of the present invention. A current controller 14 is connected to one end of each of word lines WL1 to WLn. A current controller 15 is connected to the other end of each of the word lines WL1 to WLn. To supply an erase current to the word lines WL1 to WLn, the current controller 14 applies a positive voltage to one end of each of the word lines WL1 to WLn. To supply the erase current to the word lines WL1 to WLn or supply a write current to a selected memory cell MC, the current controller 15 applies, e.g., the ground voltage to the other end of each of the word lines WL1 to WLn.

A current controller 16 is connected to bit lines BL1 to BLm. To supply the write current to a selected memory cell MC, the current controller 16 applies a positive voltage to the bit lines BL1 to BLm. Also, to supply no current to nonselected memory cells MC, the current controller 16 applies, e.g., the ground voltage to the bit lines BL1 to BLm.

The memory cell MC comprises a magnetoresistive element 12 and diode 13. One terminal of the magnetoresistive element 12 is electrically connected to the word line WL. The other terminal of the magnetoresistive element 12 is electrically connected to the cathode of the diode 13. The anode of the diode 13 is electrically connected to the bit line BL. The diode 13 functions to supply only a current that flows from the bit line BL to the word line WL via the magnetoresistive element 12.

Figure 12:
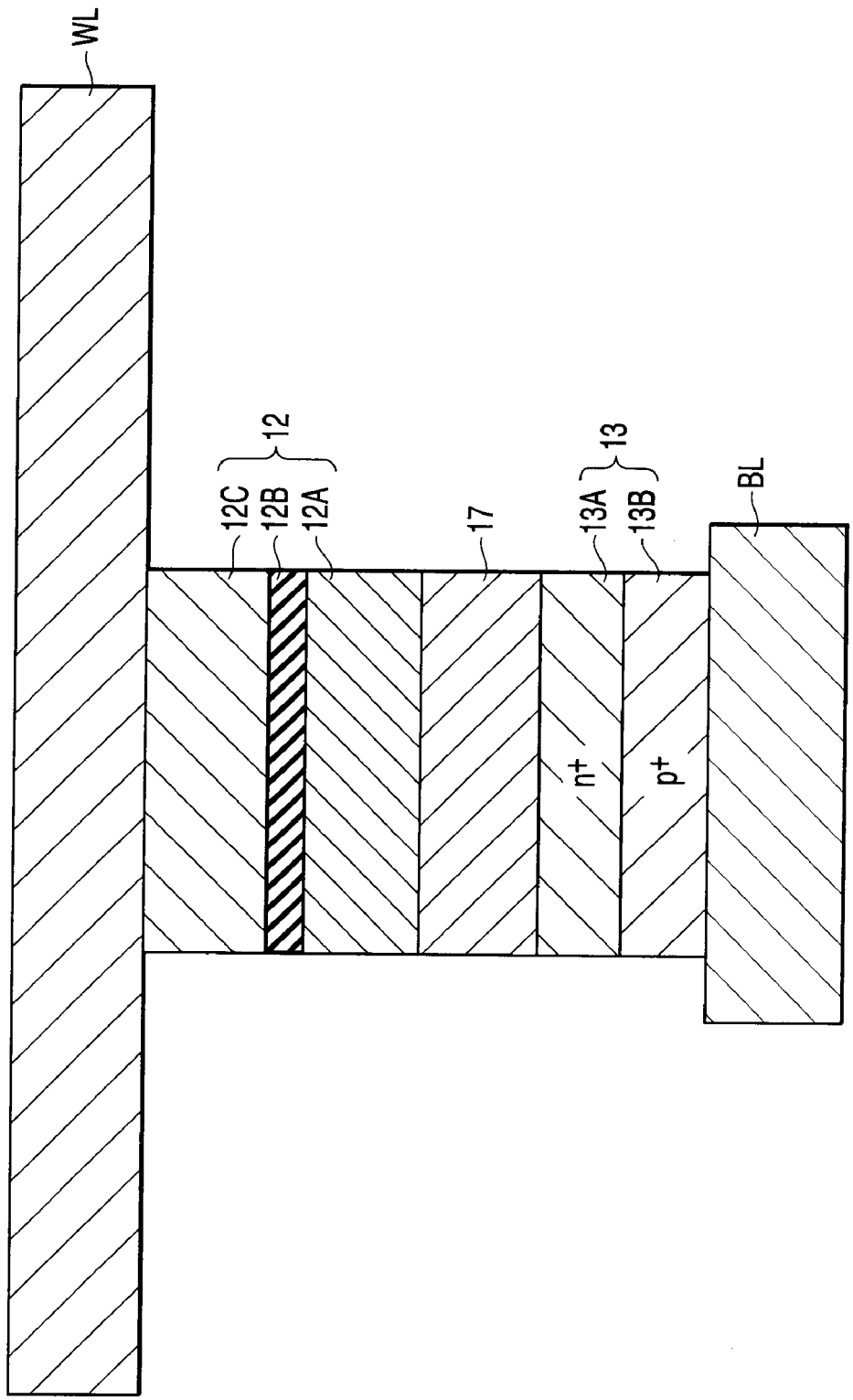
FIG. 12 is a sectional view of a memory cell MC including a magnetoresistive element 12 and diode 13 shown in FIG. 11.

FIG. 12 is a sectional view of the memory cell MC including the magnetoresistive element 12 and diode 13 shown in FIG. 11. Note that FIG. 12 shows the section cut in the direction in which the word line WL runs.

The diode 13 is formed on the bit line BL. The diode 13 comprises a $p^+$-type semiconductor layer 13B, and an $n^+$-type semiconductor layer 13A formed on the $p^+$-type semiconductor layer 13B.

The magnetoresistive element 12 is formed on the diode 13 via an electrode 17. The structure of the magnetoresistive element 12 is the same as that in the first embodiment. Note that a free layer 12C is formed close to the word line WL. The word line WL is formed on the magnetoresistive element 12.

Data write to the memory cell MC will be explained below. Data write is performed by changing the magnetization direction in the free layer 12C to a direction indicating the write state (a direction opposite to a direction indicating the erase state) by spin-transfer magnetization reversal. More specifically, data write is performed by supplying a write current Iprog flowing from the bit line BL to the word line directly to the magnetoresistive element 12. In this case, electrons flow from the word line WL to the bit line BL. These electrons are spin-polarized in the same direction as the magnetization direction of a pinned layer 12A as they are reflected by the pinned layer 12A, and injected into the free layer 12C. This makes the magnetization direction in the free layer 12C equal to the magnetization direction of the pinned layer 12A.

In this embodiment, the state in which the magnetization directions in the pinned layer 12A and free layer 12C are antiparallel is defined as the write state. In the erase state, therefore, the magnetization directions in the pinned layer 12A and free layer 12C are parallel. Accordingly, the magnetoresistive element 12 is formed along the direction in which the word line WL runs, so that a current-induced magnetic field reverses the magnetization direction in the free layer 12C to the same direction as the magnetization direction in the pinned layer 12A.

The word line WL and bit line BL select the memory cell MC as an object of data write. The current controller 16 applies a positive write voltage to a selected bit line BL. The current controller 15 applies the ground voltage to a selected word line WL. As a consequence, the write current Iprog flows through the selected memory cell MC from the bit line BL to the word line WL.

On the other hand, the current controller 16 applies a voltage (e.g., the ground voltage) equal to or lower than the write voltage to nonselected bit lines BL. This reversely biases the diodes 13 of nonselected memory cells MC.

It is also possible to simultaneously write data in a plurality of memory cells MC in the same manner as in the first embodiment.

Next, data erase from the memory cell MC will be explained. First, the current controllers 14 and 15 apply an erase current Iera to a selected word line WL. Also, the current controller 16 applies the ground voltage to all the bit lines BL electrically connected to the selected word line WL via the memory cells MC. This reversely biases the diodes 13 of all the memory cells MC electrically connected to the selected word line WL.

Data read from the memory cell MC will be explained below. The word line WL and bit line BL select the memory cell MC as an object of data read. First, a selected bit line BL is electrically connected to a read circuit (not shown). A selected word line WL is electrically connected to the ground terminal. Accordingly, a read current Iread flows through a memory cell MC2 from the bit line BL to the word line WL. On the other hand, the current controller 16 applies a predetermined voltage to the bit lines BL so as to reversely bias the diodes 13 of nonselected memory cells MC.

Figure 13:
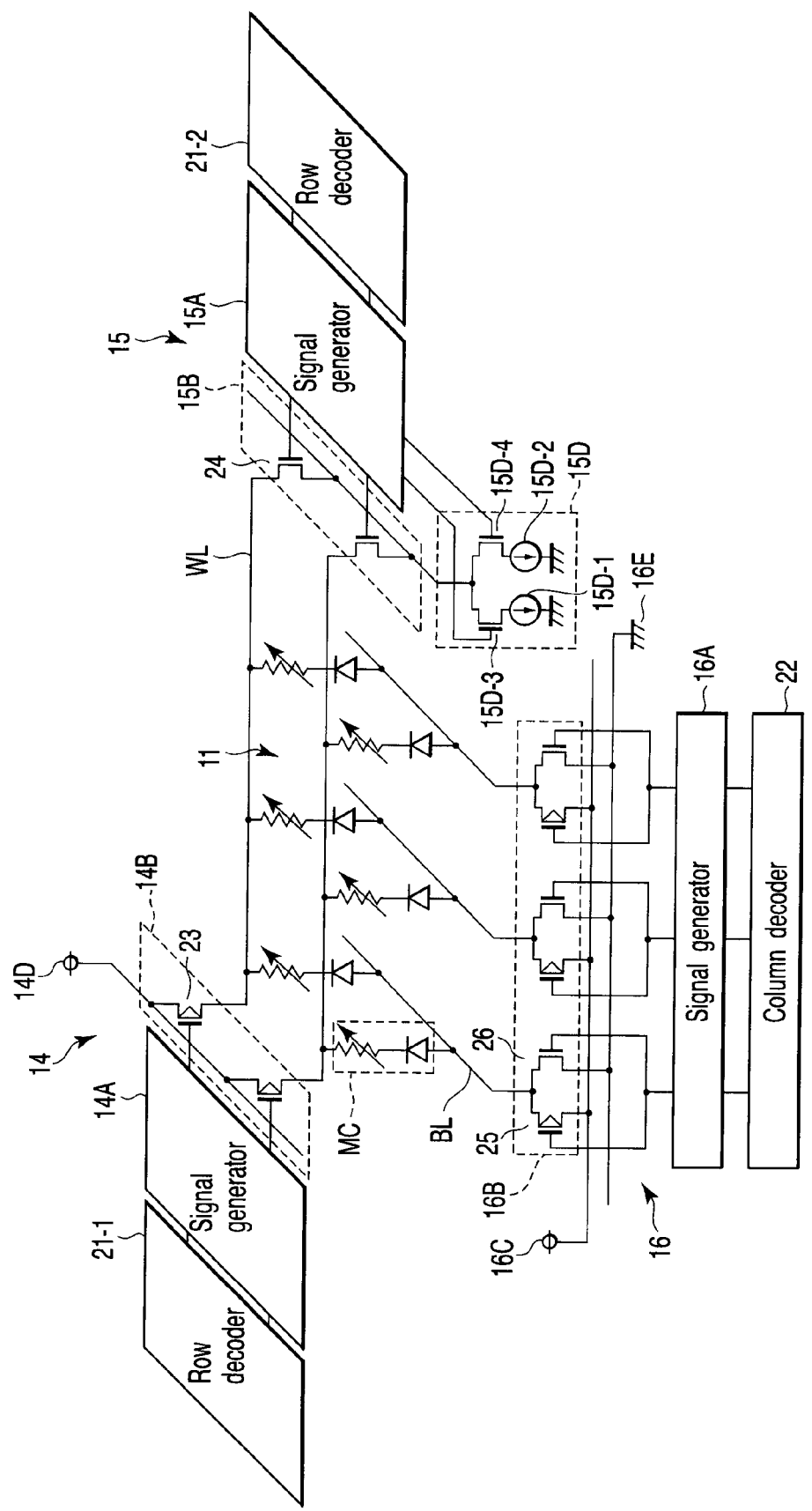
FIG. 13 is a circuit block diagram illustrating current controllers 14 to 16 according to the second embodiment.

Examples of practical circuit configurations of the current controllers 14 to 16 shown in FIG. 11 will be explained below. FIG. 13 is a circuit block diagram illustrating the current controllers 14 to 16.

The current controller 14 comprises a signal generator 14A, switching circuit 14B, and power supply 14D. The power supply 14D generates a predetermined voltage (e.g., the power supply voltage) for reversely biasing the diode 13 of the memory cell MC. The switching circuit 14B receives this power supply voltage.

The current controller 15 comprises a signal generator 15A, switching circuit 15B, and current source 15D. The current source 15D supplies currents corresponding to the erase and write operations to the switching circuit 15B. The current source 15D comprises a write current source 15D-1, an erase current source 15D-2, and switching elements 15D-3 and 15D-4. The write current source 15D-1 generates the write current. The erase current source 15D-2 generates the erase current. Each of the switching elements 15D-3 and 15D-4 is, e.g., an nMOS transistor.

The source terminal of the nMOS transistor 15D-3 is connected to the write current source 15D-1. The drain terminal of the nMOS transistor 15D-3 is connected to the switching circuit 15B. The signal generator 15A supplies a control signal to the gate terminal of the nMOS transistor 15D-3. The source terminal of the nMOS transistor 15D-4 is connected to the erase current source 15D-2. The drain terminal of the nMOS transistor 15D-4 is connected to the switching circuit 15B. The signal generator 15A supplies a control signal to the gate terminal of the nMOS transistor 15D-4.

On the basis of a decoded signal supplied from a row decoder 21-2, the signal generator 15A generates a control signal for electrically connecting the current source 15D to a selected word line WL. The switching circuit 15B receives this control signal. Also, the signal generator 14A generates a control signal for selecting the write current or erase current. The current source 15D receives this control signal.

The current controller 16 comprises a signal generator 16A, a switching circuit 16B, and power supplies 16C and 16E. The power supply 16C generates a predetermined voltage (in this embodiment, the power supply voltage) used to supply the write current and read current to the memory cell MC. The switching circuit 16B receives this power supply voltage. Also, the power supply 16E generates a predetermined voltage (in this embodiment, the ground voltage) for reversely biasing the diode 13 of the memory cell MC. The switching circuit 16B receives this ground voltage.

On the basis of a decoded signal supplied from a column decoder 22, the signal generator 16A generates a first control signal for electrically connecting the power supply 16C to a selected bit line BL. The signal generator 16A also generates a second control signal for electrically connecting the power supply 16E to nonselected bit lines BL, on the basis of the decoded signal supplied from the column decoder 22. In addition, during an erase operation, the signal generator 16A generates a third control signal for electrically connecting the power supply 16E to all the bit lines BL. The switching circuit 16B receives the first to third control signals.

The switching circuit 16B comprises a plurality of pMOS transistors 25 corresponding to the bit lines BL1 to BLm, and a plurality of nMOS transistors 26 corresponding to the bit lines BL1 to BLm. The source terminal of each pMOS transistor 25 is connected to the power supply 16C. The source terminal of each nMOS transistor 26 is connected to the power supply 16E.

The operation of the MRAM having the arrangement as shown in FIG. 13 will be explained below. FIG. 14 is a circuit diagram illustrating the operation of the MRAM. FIG. 15 is a view illustrating the contents of control signals generated by the signal generators 14A, 15A, and 16A. Note that FIG. 14 shows two word lines WL (the word lines WL1 and WL2) and two bit lines BL (the bit lines BL1 and BL2) as examples.

First, the operation of the MRAM in a standby state will be explained. In the standby state, the signal generator 14A generates Low-level control signals bRSP1 and bRSP2, and pMOS transistors 23 corresponding to the control signals bRSP1 and bRSP2 receive them at their gate terminals. This turns on all the pMOS transistors 23, and electrically connects the word lines WL1 and WL2 to the power supply 14D.

The signal generator 15A generates Low-level control signals PC and EC. The nMOS transistors 15D-3 and 15D-4 respectively receive the control signals PC and EC at their gate terminals. This turns off the nMOS transistors 15D-3 and 15D-4.

The signal generator 15A also generates Low-level control signals RSN1 and RSN2, and nMOS transistors 24 corresponding to the control signals RSN1 and RSN2 receive them at their gate terminals.

The signal generator 16A generates High-level control signals bCS1 and bCS2. The pMOS transistor 25 and nMOS transistor 26 corresponding to the control signal bCS1 receive it at their gate terminals. The pMOS transistor 25 and nMOS transistor 26 corresponding to the control signal bCS2 receive it at their gate terminals. This electrically connects the bit lines BL1 and BL2 to the power supply 16E.

The above control in the standby state reversely biases the diode 13 of each memory cell MC. That is, no current flows to any memory cell MC.

Next, data erase from the memory cell MC will be explained. Note that data erase from two memory cells connected to the word line WL1 will be explained as an example.

The signal generator 14A generates Low-level control signals bRSP1 and bRSP2. The PMOS transistors 23 corresponding to the control signals bRSP1 and bRSP2 receive them at their gate terminals. This electrically connects the word lines WL1 and WL2 to the power supply 14D.

The signal generator 15A generates a Low-level control signal PC and High-level control signal EC. This turns off the nMOS transistor 15D-3 and turns on the nMOS transistor 15D-4.

Also, on the basis of the decoded signal from the row decoder 21-2, the signal generator 15A generates a High-level control signal RSN1 in order to turn on the nMOS transistor 24 connected to the selected word line WL1. Furthermore, on the basis of the decoded signal from the row decoder 21-2, the signal generator 15A generates a Low-level control signal RSN2 in order to turn off the nMOS transistor 24 connected to the nonselected word line WL2. This electrically connects the erase current source 15D-2 and word line WL1.

The above control in the erase operation supplies the erase current Iera to only the word line WL1. In this manner, data in a plurality of memory cells MC connected to the selected word line WL is simultaneously erased.

During data erase, it is necessary to prevent the erase current Iera flowing through the word line WL1 from flowing to the memory cells MC. Therefore, the signal generator 16A generates High-level control signals bCS1 and bCS2. This electrically connects the bit lines BL1 and BL2 to the power supply 16E, and reversely biases the diodes 13 of all the memory cells MC connected to the word line WL1.

Data write to the memory cell MC will be explained below. Note that data write to a memory cell MC1 connected to the word line WL1 and bit line BL1 will be explained as an example.

The signal generator 14A generates a High-level control signal bRSP1 and Low-level control signal bRSP2. The PMOS transistors 23 corresponding to the control signals bRSP1 and bRSP2 receive them at their gate terminals. This electrically connects the word line WL2 and power supply 14D.

The signal generator 15A generates a High-level control signal PC and Low-level control signal EC. This turns on the nMOS transistor 15D-3 and turns off the nMOS transistor 15D-4.

Also, on the basis of the decoded signal from the row decoder 21-2, the signal generator 15A generates a High-level control signal RSN1 in order to turn on the nMOS transistor 24 connected to the selected word line WL1. Furthermore, on the basis of the decoded signal from the row decoder 21-2, the signal generator 15A generates a Low-level control signal bRSN2 in order to turn off the nMOS transistor 24 connected to the nonselected word line WL2. This electrically connects the erase current source 15D-1 and word line WL1.

The signal generator 16A generates a Low-level control signal bCS1 on the basis of the decoded signal from the column decoder 22. This electrically connects the bit line BL1 and power supply 16C.

The above control in the write operation supplies the write current Iprog to only the selected memory cell MC1. In this way, data is written in the selected memory cell MC1.

During data write, it is necessary to prevent the write current Iprog from flowing to nonselected memory cells MC. Therefore, the signal generator 16A generates a High-level control signal bCS2 in order to turn on the nMOS transistor 26 connected to the nonselected bit line BL2. This electrically connects the nonselected bit line BL2 and power supply 16E, and reversely biases the diodes 13 of the memory cells MC connected to the nonselected bit line BL2.

Data read from the memory cell MC will be explained below. Note that data read from the memory cell MC1 connected to the word line WL1 and bit line BL1 will be explained as an example.

Each word line WL is also connected to a read circuit (not shown). The signal generator 15A electrically connects the selected word line WL1 and read circuit on the basis of the decoded signal from the row decoder 21-2.

The signal generator 14A generates a High-level control signal bRSP1 and Low-level control signal bRSP2. The pMOS transistors 23 corresponding to the control signals bRSP1 and bRSP2 receive them at their gate terminals. This electrically connects the word line WL2 and power supply 14D.

On the basis of the decoded signal from the column decoder 22, the signal generator 16A generates a Low-level control signal bCS1 in order to turn on the pMOS transistor 25 connected to the selected bit line BL1. This turns on the pMOS transistor 25 corresponding to the bit line BL1, and electrically connects the bit line BL1 and power supply 16C.

The signal generator 16A also generates a High-level control signal bCS2 in order to turn on the nMOS transistor 26 connected to the nonselected bit line BL2. This electrically connects the bit line BL2 and power supply 16E, and reversely biases the diodes 13 of the memory cells MC connected to the nonselected bit line BL2.

The above control in the read operation supplies the read current Iread to only the selected memory cell MC1. In this way, data is read out from the selected memory cell MC1.

As has been described in detail above, this embodiment can form an MRAM even when the diode 13 is connected in the direction opposite to that in the first embodiment. The remaining effects are the same as in the first embodiment.

Third Embodiment

In the third embodiment, the memory cell of the first embodiment is used as a basic configuration, and two basic configurations are stacked.

Figure 16:
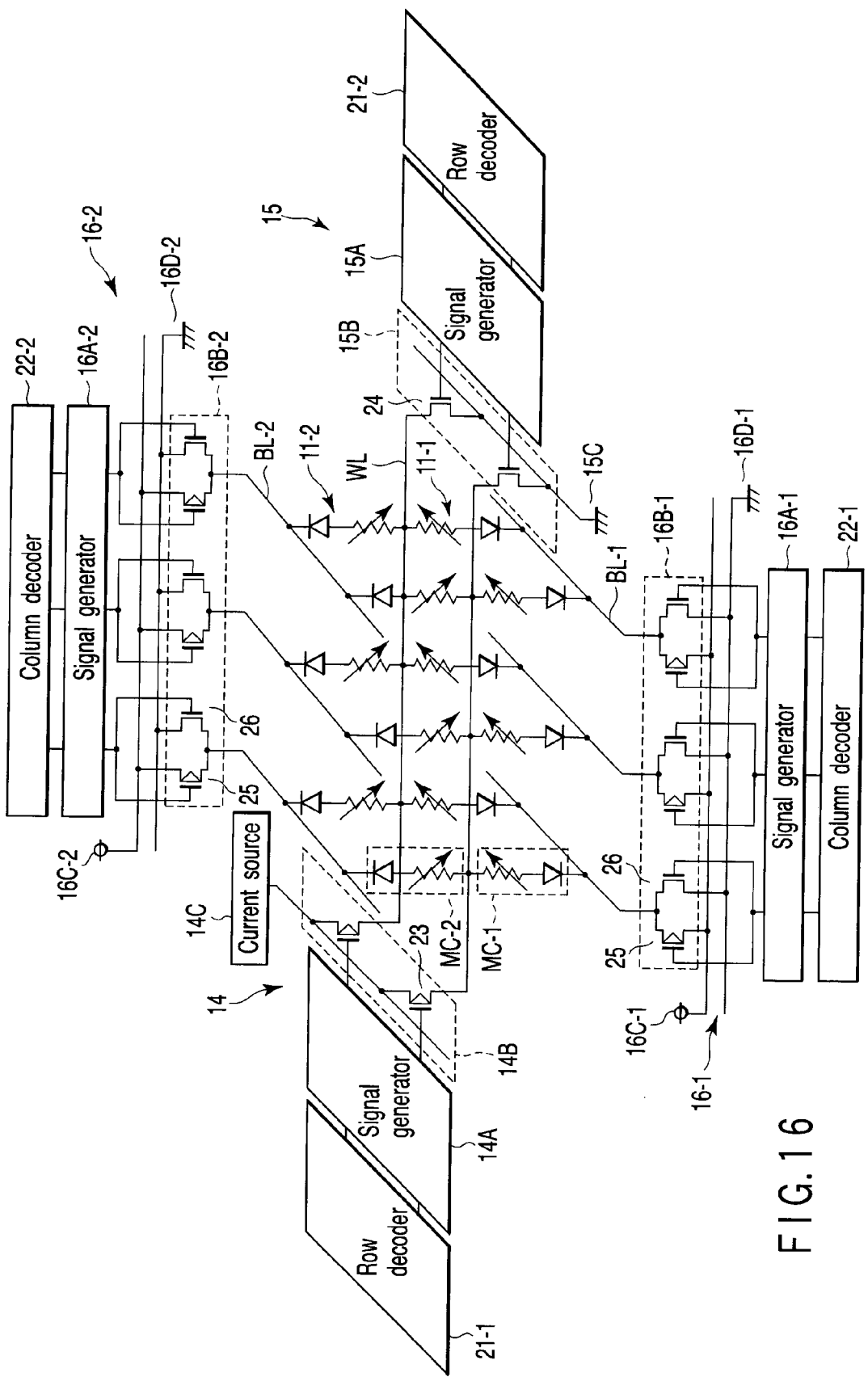
FIG. 16 is a circuit block diagram illustrating an MRAM according to the third embodiment of the present invention.

FIG. 16 is a circuit block diagram illustrating an MRAM according to the third embodiment of the present invention. This MRAM comprises first and second memory cell arrays 11-1 and 11-2. In the first memory cell array 11-1, a plurality of memory cells MC-1 are arranged in a matrix. In the second memory cell array 11-2, a plurality of memory cells MC-2 are arranged in a matrix.

The memory cell MC-1 comprises a magnetoresistive element 12-1 and diode 13-1. The memory cell MC-2 comprises a magnetoresistive element 12-2 and diode 13-2.

The memory cells MC-1 and MC-2 share a word line WL. That is, one terminal of the magnetoresistive element 12-1 is electrically connected to the word line WL. One terminal of the magnetoresistive element 12-2 is also connected to the word line WL.

A plurality of bit lines BL-1 are formed in one-to-one correspondence with a plurality of columns in the first memory cell array 11-1. A plurality of bit lines BL-2 are formed in one-to-one correspondence with a plurality of columns in the second memory cell array 11-2. The cathode of the diode 13-1 is electrically connected to the bit line BL-1. The cathode of the diode 13-2 is electrically connected to the bit line BL-2.

Figure 17:
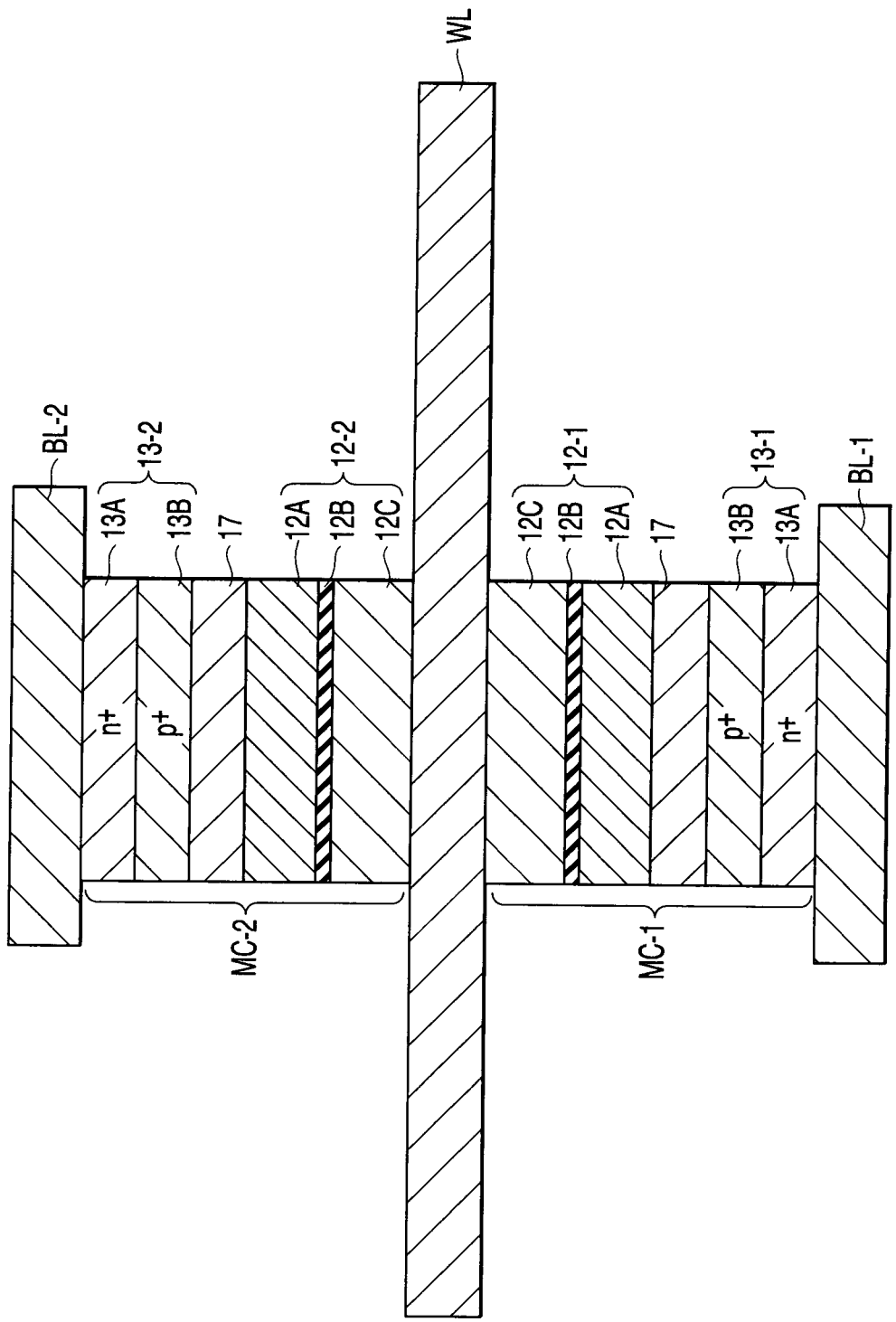
FIG. 17 is a sectional view of memory cells MC-1 and MC-2 shown in FIG. 16.

FIG. 17 is a sectional view of the memory cells MC-1 and MC-2 shown in FIG. 16. Note that FIG. 17 shows the section cut in the direction in which the word line WL runs.

The diode 13-1 is formed on the bit line BL-1. The diode 13-1 comprises an $n^+$-type semiconductor layer 13A, and a $p^+$-type semiconductor layer 13B formed on the $n^+$-type semiconductor layer 13A.

The magnetoresistive element 12-1 is formed on the diode 13-1 via an electrode 17. The word line WL is formed on the magnetoresistive element 12-1. The magnetoresistive element 12-2 is formed on the word line WL. A free layer 12C of the magnetoresistive element 12-2 is formed close to the word line WL.

The diode 13-2 is formed on the magnetoresistive element 12-2 via an electrode 17. The diode 13-2 comprises a $p^+$-type semiconductor layer 13B, and an $n^+$-type semiconductor layer 13A formed on the $p^+$-type semiconductor layer 13B. The bit line BL-2 is formed on the diode 13-2.

As shown in FIG. 16, a current controller 16-1 is connected to the bit lines BL-1. A current controller 16-2 is connected to the bit lines BL-2. The current controller 16-1 comprises a signal generator 16A-1, switching circuit 16B-1, power supply 16C-1, and current sink 16D-1. The current controller 16-2 comprises a signal generator 16A-2, switching circuit 16B-2, power supply 16C-2, and current sink 16D-2. The operation of the current controllers 16-1 and 16-2 is the same as the current controller 16 explained in the first embodiment.

A column decoder 22-1 is connected to the current controller 16-1. A column decoder 22-2 is connected to the current controller 16-2. The column decoders 22-1 and 22-2 decode column address signals and supply the decoded signals to the current controllers 16-1 and 16-2, respectively.

As described above, two memory cell layers each comprising a magnetoresistive element and diode can be formed by using the MRAM of the first embodiment as a basic configuration. That is, the memory cell array 11-2 can be stacked on the memory cell array 11-1. This makes it possible to make the storage capacity twice that in the first embodiment without increasing the chip area.

Fourth Embodiment

In the fourth embodiment, the memory cell of the second embodiment is used as a basic configuration, and two basic configurations are stacked.

Figure 18:
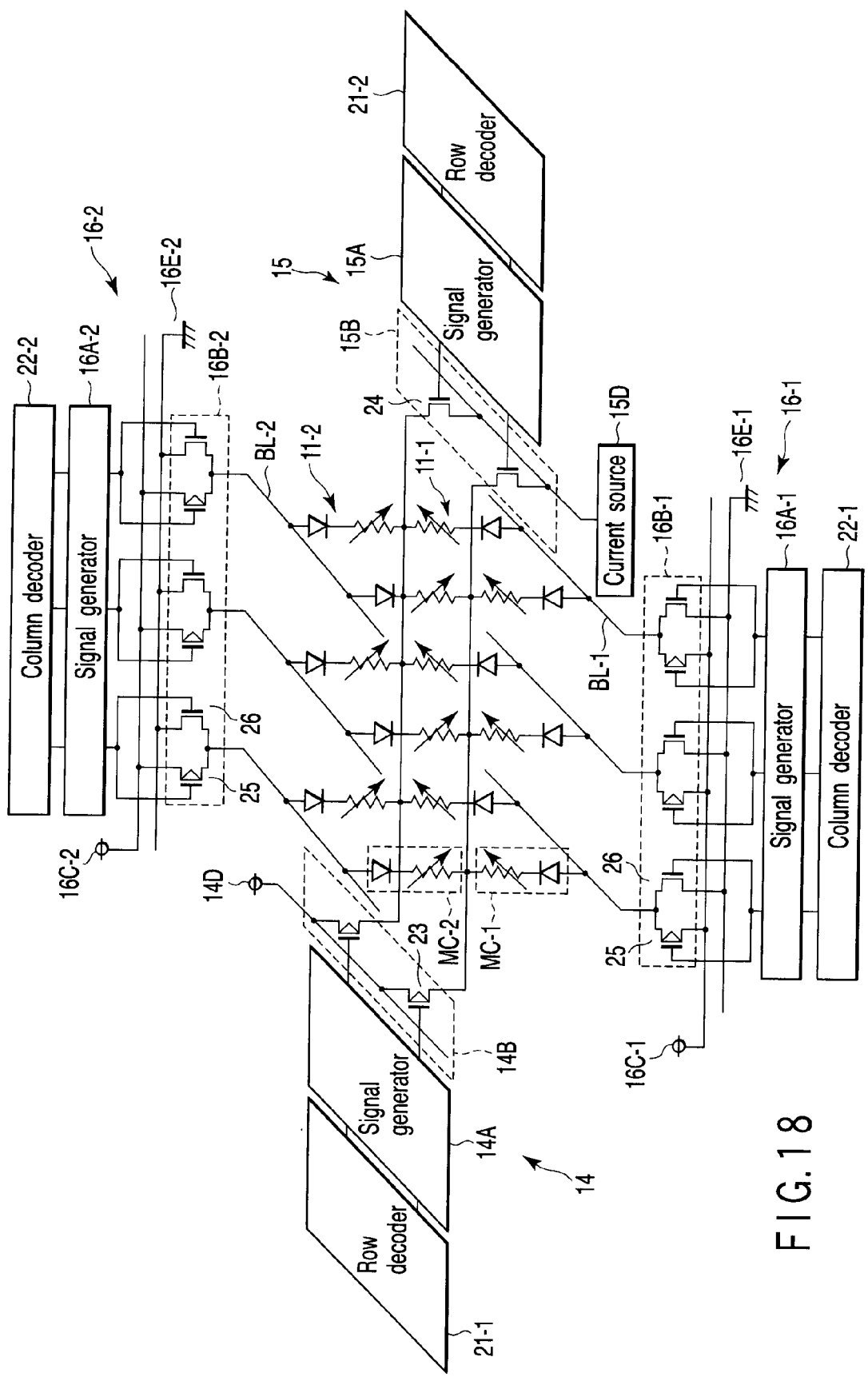
FIG. 18 is a circuit block diagram illustrating an MRAM according to the fourth embodiment of the present invention.

FIG. 18 is a circuit block diagram illustrating an MRAM according to the fourth embodiment of the present invention. A current controller 16-1 is connected to a plurality of bit lines BL-1. A current controller 16-2 is connected to a plurality of bit lines BL-2. The current controller 16-1 comprises a signal generator 16A-1, a switching circuit 16B-1, and power supplies 16C-1 and 16E-1. The current controller 16-2 comprises a signal generator 16A-2, a switching circuit 16B-2, and power supplies 16C-2 and 16E-2. The operation of the current controllers 16-1 and 16-2 is the same as the current controller 16 explained in the second embodiment.

Figure 19:
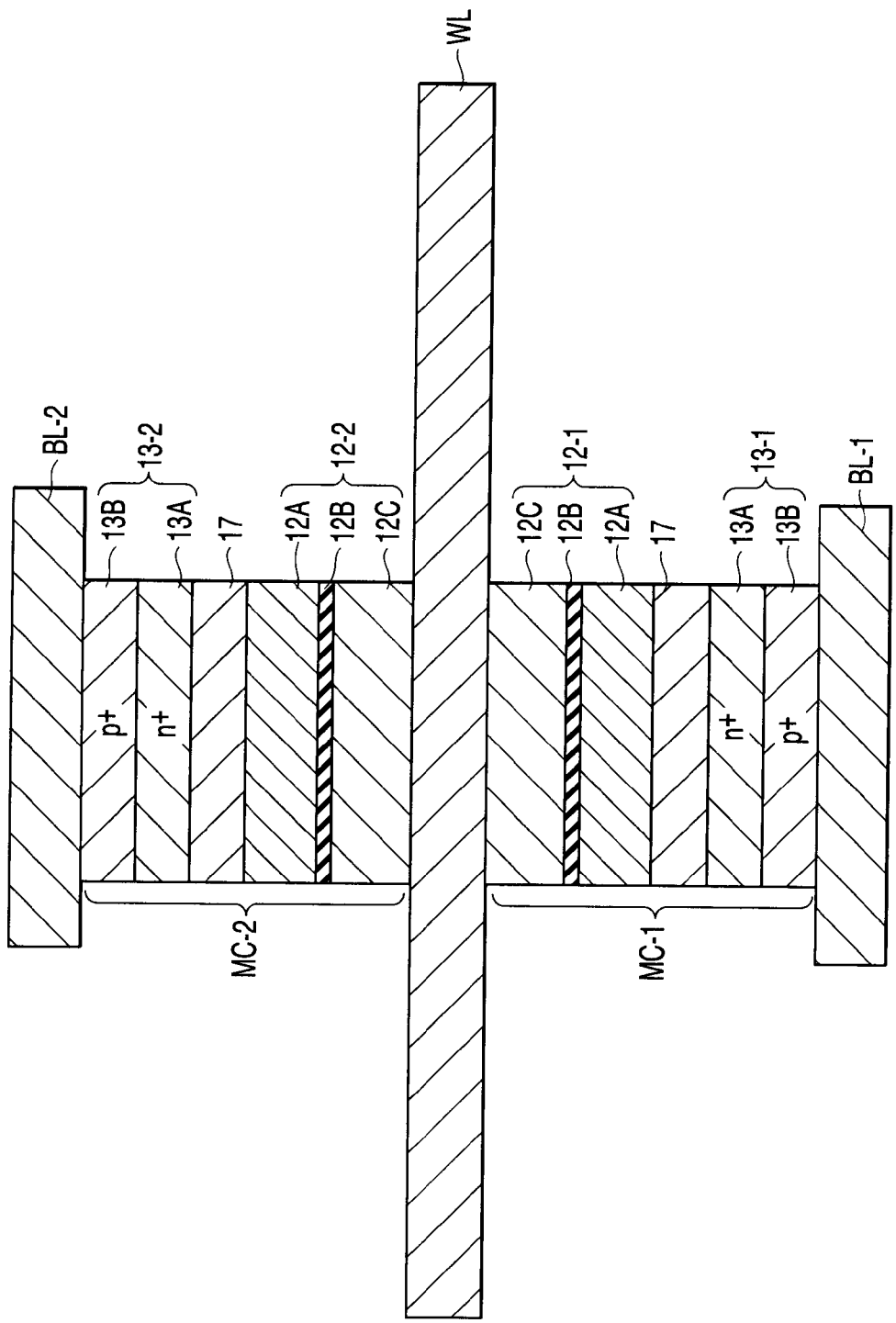
FIG. 19 is a sectional view of memory cells MC-1 and MC-2 shown in FIG. 18.

FIG. 19 is a sectional view of memory cells MC-1 and MC-2 shown in FIG. 18. Note that FIG. 19 shows the section cut in the direction in which a word line WL runs.

A diode 13-1 is formed on the bit line BL-1. The diode 13-1 comprises a $p^+$-type semiconductor layer 13B, and an $n^+$-type semiconductor layer 13A formed on the $p^+$-type semiconductor layer 13B.

A magnetoresistive element 12-1 is formed on the diode 13-1 via an electrode 17. The word line WL is formed on the magnetoresistive element 12-1. A magnetoresistive element 12-2 is formed on the word line WL. A free layer 12C of the magnetoresistive element 12-2 is formed close to the word line WL.

A diode 13-2 is formed on the magnetoresistive element 12-2 via an electrode 17. The diode 13-2 comprises an $n^+$-type semiconductor layer 13A, and a $p^+$-type semiconductor layer 13B formed on the $n^+$-type semiconductor layer 13A. The bit line BL-2 is formed on the diode 13-2.

As described above, memory cell layers each comprising a magnetoresistive element and diode can be formed by using the MRAM of the second embodiment as a basic configuration.

Fifth Embodiment

The fifth embodiment forms an MRAM by using a transistor instead of a diode included in a memory cell MC.

FIG. 20 is a circuit block diagram illustrating an MRAM according to the fifth embodiment of the present invention. A current controller 14 is connected to one end of each of word lines WL1 to WLn. A current controller 15 is connected to the other end of each of the word lines WL1 to WLn. To supply an erase current and write current to the word lines WL1 to WLn, the current controller 14 applies a positive voltage to one end of each of the word lines WL1 to WLn. To supply the erase current to the word lines WL1 to WLn, the current controller 15 applies, e.g., the ground voltage to the other end of each of the word lines WL1 to WLn.

A signal generator 32 is connected to bit lines BL1 to BLm. In data write and data read, the signal generator 32 generates a control signal for activating a selected bit line BL.

The memory cell MC comprises a magnetoresistive element 12 and selection transistor 31. The selection transistor 31 comprises, e.g., an nMOS transistor, and connects/disconnects the magnetoresistive element 12 and ground terminal.

One terminal of the magnetoresistive element 12 is electrically connected to the word line WL. The other terminal of the magnetoresistive element 12 is electrically connected to the drain terminal of the selection transistor 31. The gate terminal of the selection transistor 31 is electrically connected to the bit line BL. The source terminal of the selection transistor 31 is grounded.

FIG. 21 is a sectional view of the memory cell MC including the magnetoresistive element 12 and selection transistor 31 shown in FIG. 20. Note that FIG. 21 shows the section cut in the direction in which the word line WL runs.

A source region 42 and drain region 43 are formed in a p-type semiconductor substrate 41. The semiconductor substrate 41 is made of, e.g., Si (silicon). Each of the source region 42 and drain region 43 is an $n^+$-type diffusion region formed by heavily doping an $n^+$-type impurity into silicon.

Between the source region 42 and drain region 43, a gate electrode 45 is formed on the p-type semiconductor substrate 41 via a gate insulating film 44. The gate electrode 45 corresponds to the bit line BL. The gate insulating film 44 is made of, e.g., a silicon oxide film. The gate electrode 45 is made of, e.g., polysilicon.

The magnetoresistive element 12 is formed on the drain region 43 via a via plug 46. The word line WL is formed on the magnetoresistive element 12. A wiring layer 48 to which the ground voltage is applied is formed on the source region 42 via a via plug 47. The via plugs 46 and 47 and wiring layer 48 are made of, e.g., Cu (copper). Also, an interlayer dielectric layer made of a silicon oxide film or the like fills the portion between the p-type semiconductor substrate 41 and word line WL.

Data erase from the memory cell MC will be explained below. In data erase, the current controllers 14 and 15 supply an erase current Iera to a selected word line WL. The signal generator 32 supplies a Low-level control signal to all the bit lines BL. This turns off the selection transistors 31. Consequently, it is possible to prevent the erase current Iera from flowing to the memory cells MC.

Data write to the memory cell will be explained below. The word line WL and bit line BL select the memory cell MC as an object of data write.

The signal generator 32 activates a selected bit line BL (to High level). This turns on the selection transistor 31 of a selected memory cell MC, and connects the other terminal of the magnetoresistive element 12 to the ground terminal. The current controller 14 applies a positive write voltage to a selected word line WL. As a consequence, a write current Iprog flows to the selected memory cell MC. It is also possible to simultaneously write data in a plurality of memory cells MC connected to the same word line WL.

Data read from the memory cell MC will be explained below. The word line WL and bit line BL select the memory cell MC as an object of data read.

A selected word line WL is electrically connected to a read circuit (not shown). The signal generator 32 activates a selected bit line BL (to High level), and deactivates nonselected bit lines BL (to Low level). This turns on the selection transistor 31 of a selected memory cell MC, and connects the other terminal of the magnetoresistive element 12 to the ground terminal. As a result, a read current Iread flows to the selected memory cell MC.

Examples of practical circuit configurations of the current controllers 14 and 15 shown in FIG. 20 will be explained below. FIG. 22 is a circuit block diagram illustrating the current controllers 14 and 15.

The current controller 14 comprises a signal generator 14A, switching circuit 14B, and current source 14C. The current source 14C supplies currents corresponding to the erase and write operations to the switching circuit 14B.

The current controller 15 comprises a signal generator 15A, switching circuit 15B, and current sink 15C. In data erase, the current sink 15C supplies a current flowing through the word lines WL to the ground terminal.

The signal generator 32 activates a selected bit line BL (to High level) on the basis of a decoded signal supplied from a column decoder 22.

The operation of the MRAM having the arrangement as shown in FIG. 22 will be explained below. First, data erase from the memory cell MC will be explained.

First, one end of a selected word line WL is electrically connected to the current source 14C, and the other end of the selected word line WL is electrically connected to the current sink 15C. In addition, it is necessary to prevent the erase current Iera flowing through the word line WL from flowing to the memory cell MC during data erase. Therefore, the signal generator 32 deactivates all the bit lines BL (to Low level).

As a consequence, the erase current Iera flows through the selected word line WL. In this manner, data in a plurality of memory cells MC connected to the selected word line WL is simultaneously erased.

Data write to the memory cell MC will be explained below. First, a selected word line WL is electrically connected to the current source 14C. On the basis of the decoded signal from the column decoder 22, the signal generator 32 activates a selected bit line BL to (High level).

Also, it is necessary to prevent the write current Iprog from flowing to nonselected memory cells MC. Therefore, the signal generator 32 deactivates nonselected bit lines BL (to Low level). Consequently, the write current Iprog flows to only a selected memory cell MC. In this way, data is written in the selected memory cell MC.

As has been described in detail above, this embodiment can form the memory cell MC by using the selection transistor 31. This embodiment can make the circuit for controlling the bit lines BL simpler than that in the first embodiment.

Furthermore, it is possible to perform the erase and write operations at high speed, and increase the capacity of the MRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory, comprising:
    a plurality of magnetoresistive elements which include a fixed layer in which a magnetization direction is fixed, a free layer in which a magnetization direction changes, and a nonmagnetic layer formed between the fixed layer and the free layer, and records data by a resistance value which changes on the basis of the magnetization direction of the free layer;
    a word line electrically connected to first terminals of the magnetoresistive elements;
    a plurality of bit lines electrically connected to second terminals of the magnetoresistive elements, respectively; and
    a current controller configured to,
        during data erase, supply a current to the word line to generate a magnetic field without supplying a current to the bit lines, set the magnetization direction of the free layer in a first direction by the magnetic field, and erase data of the magnetoresistive elements electrically connected to the word line by one time data erase, and
        during data write, supply a current in one direction to each magnetoresistive element using the word line and the bit lines, and set the magnetization direction of the free layer in a second direction by spin transfer magnetization reversal.

2. The memory according to claim 1, further comprising:
    a plurality of diodes which are electrically connected between the second terminals of the magnetoresistive elements and the bit lines, and sets a direction of a current flowing through the magnetoresistive element.

3. The memory according to claim 2, wherein
an anode of the diode is electrically connected to the magnetoresistive element, and
a cathode of the diode is electrically connected to the bit line.

4. The memory according to claim 2, wherein
an anode of the diode is electrically connected to the bit line, and
a cathode of the diode is electrically connected to the magnetoresistive element.

5. The memory according to claim 2, wherein the diodes are formed by stacking an n-type semiconductor layer and a p-type semiconductor layer.

6. The memory according to claim 5, wherein the diodes and the magnetoresistive elements are stacked.

7. The memory according to claim 2, wherein during data erase, the current controller reversely biases the diodes such that a current does not flow to the magnetoresistive elements.

8. The memory according to claim 2, wherein during data write, the current controller reversely biases a diode electrically connected to a nonselected magnetoresistive element such that a current does not flow to the nonselected magnetoresistive element.

9. The memory according to claim 1, wherein
the magnetoresistive elements include a plurality of first magnetoresistive elements and a plurality of second magnetoresistive elements,
the first magnetoresistive elements are arranged on one side of the word line,
the second magnetoresistive elements are arranged on the other side of the word line, and
the first magnetoresistive elements and the second magnetoresistive elements share the word line.

10. The memory according to claim 9, wherein the second magnetoresistive elements are stacked on the first magnetoresistive elements via the word line.

11. The memory according to claim 10, wherein the free layer is placed close to the word line.

12. The memory according to claim 1, wherein the word line includes a metal layer and a magnetic layer covering the metal layer.

13. The memory according to claim 1, further comprising:
a plurality of selection transistors electrically connected to the second terminals of the magnetoresistive elements, wherein
the bit lines are connected to gate terminals of the selection transistors, respectively.

14. The memory according to claim 13, wherein source terminals of the selection transistors are grounded.

15. The memory according to claim 1, wherein data of at least two magnetoresistive elements are written by one time data write.

* * * * *